United States Patent [19]

Mihara

[11] Patent Number: 5,751,625
[45] Date of Patent: May 12, 1998

[54] FERROELECTRIC MEMORY AND RECORDING DEVICE USING THE SAME

[75] Inventor: Takashi Mihara, Iruma, Japan

[73] Assignee: Olympus Optical Co., Ltd., Tokyo, Japan

[21] Appl. No.: 702,832

[22] Filed: Aug. 23, 1996

[30] Foreign Application Priority Data

Aug. 28, 1995 [JP] Japan .................................. 7-219185

[51] Int. Cl.$^6$ .................................................. G11C 11/22
[52] U.S. Cl. .................................................. 365/145; 365/45
[58] Field of Search ........................ 365/145, 45, 149, 365/117, 65

[56] References Cited

U.S. PATENT DOCUMENTS

| | | | |
|---|---|---|---|
| 4,890,259 | 12/1989 | Simko | 365/45 |
| 5,262,983 | 11/1993 | Brennan | 365/145 |
| 5,446,688 | 8/1995 | Torimaru | 365/145 |
| 5,530,667 | 6/1996 | Omura et al. | 365/145 |

FOREIGN PATENT DOCUMENTS 2-185789  7/1990  Japan .

*Primary Examiner*—Vu A. Le
*Attorney, Agent, or Firm*—Frishauf, Holtz, Goodman, Langer & Chick

[57] ABSTRACT

A ferroelectric memory having a thin ferroelectric film sandwiched between a pair of electrodes as a memory cell includes a first pulse generating circuit for applying a first pulse having a voltage Ve higher than a coercive voltage Vc of the thin ferroelectric film to the memory cell, thereby forming a polarized state in a first direction of two states of polarization, a second pulse generating circuit for applying to the memory cell a second pulse having a voltage Vw whose polarity is opposite to a polarity of the first pulse applied by the first pulse generating circuit, thereby forming a partially polarized state containing both domains having polarization in the first direction and domains having polarization in a second direction opposite to the first direction, and an analog recording unit for performing analog recording by controlling the partially polarized state by using the second pulse generated by the second pulse generating circuit.

20 Claims, 21 Drawing Sheets

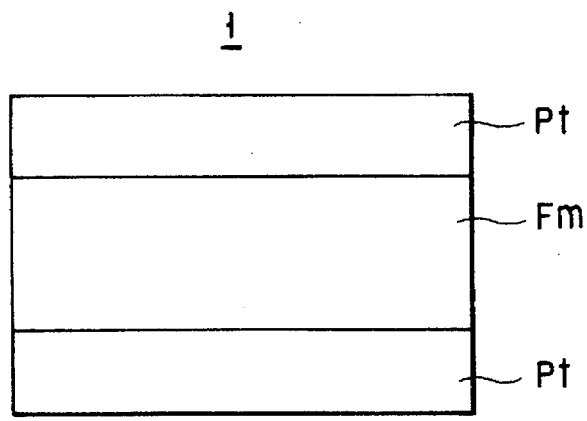
F I G. 1
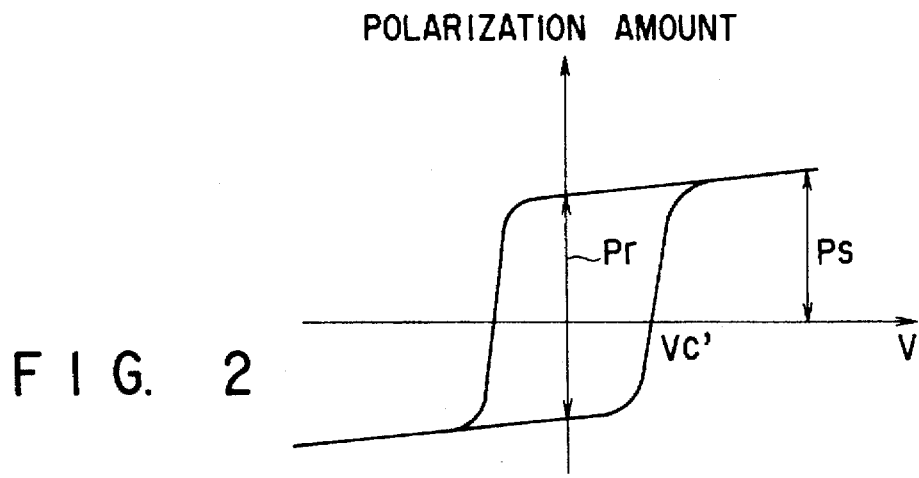
F I G. 2
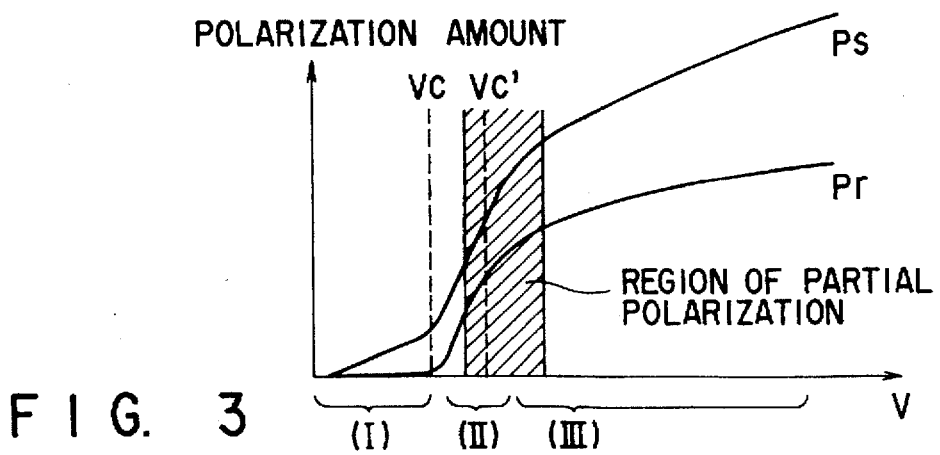
F I G. 3

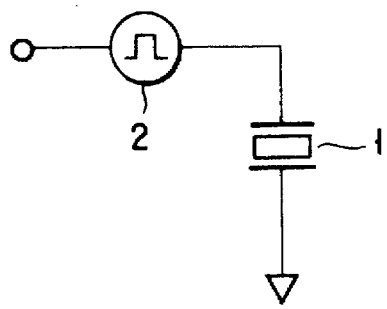
F I G. 4A
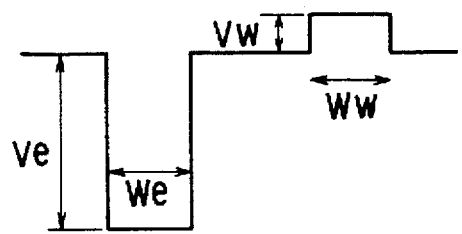
F I G. 4B
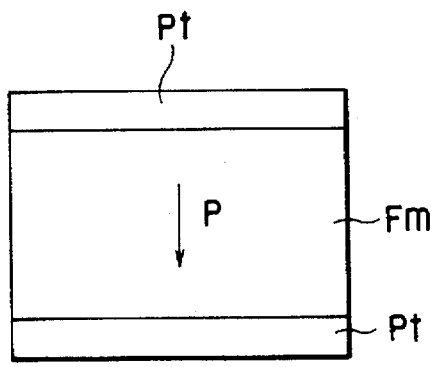
F I G. 5A
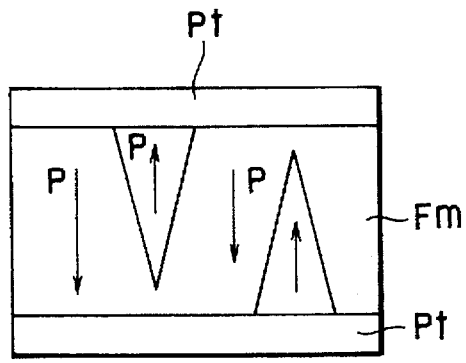
F I G. 5B
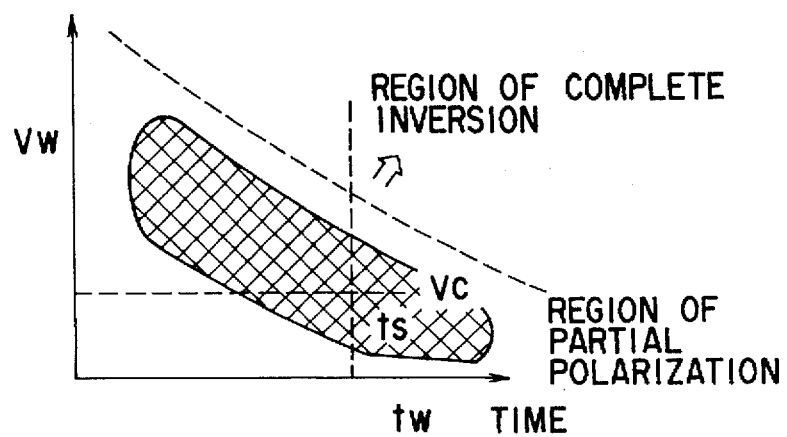
F I G. 6

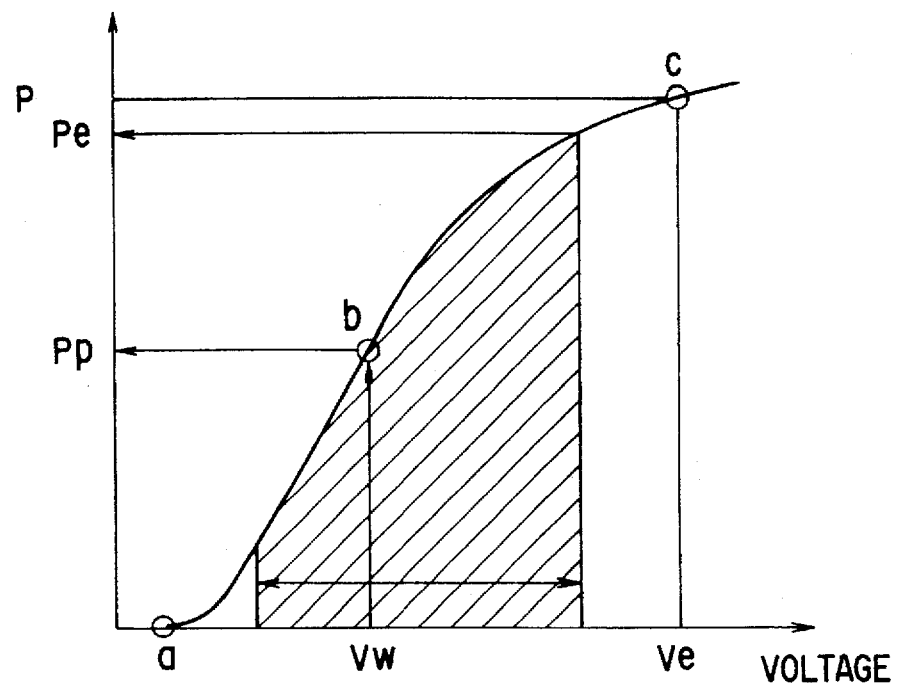
F I G. 7
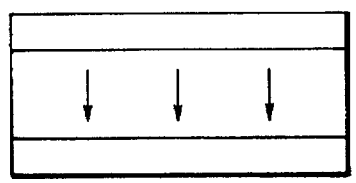
F I G. 8A
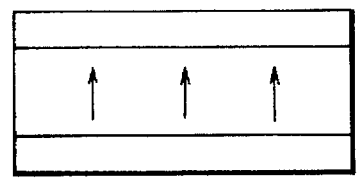
F I G. 8B
F I G. 8C

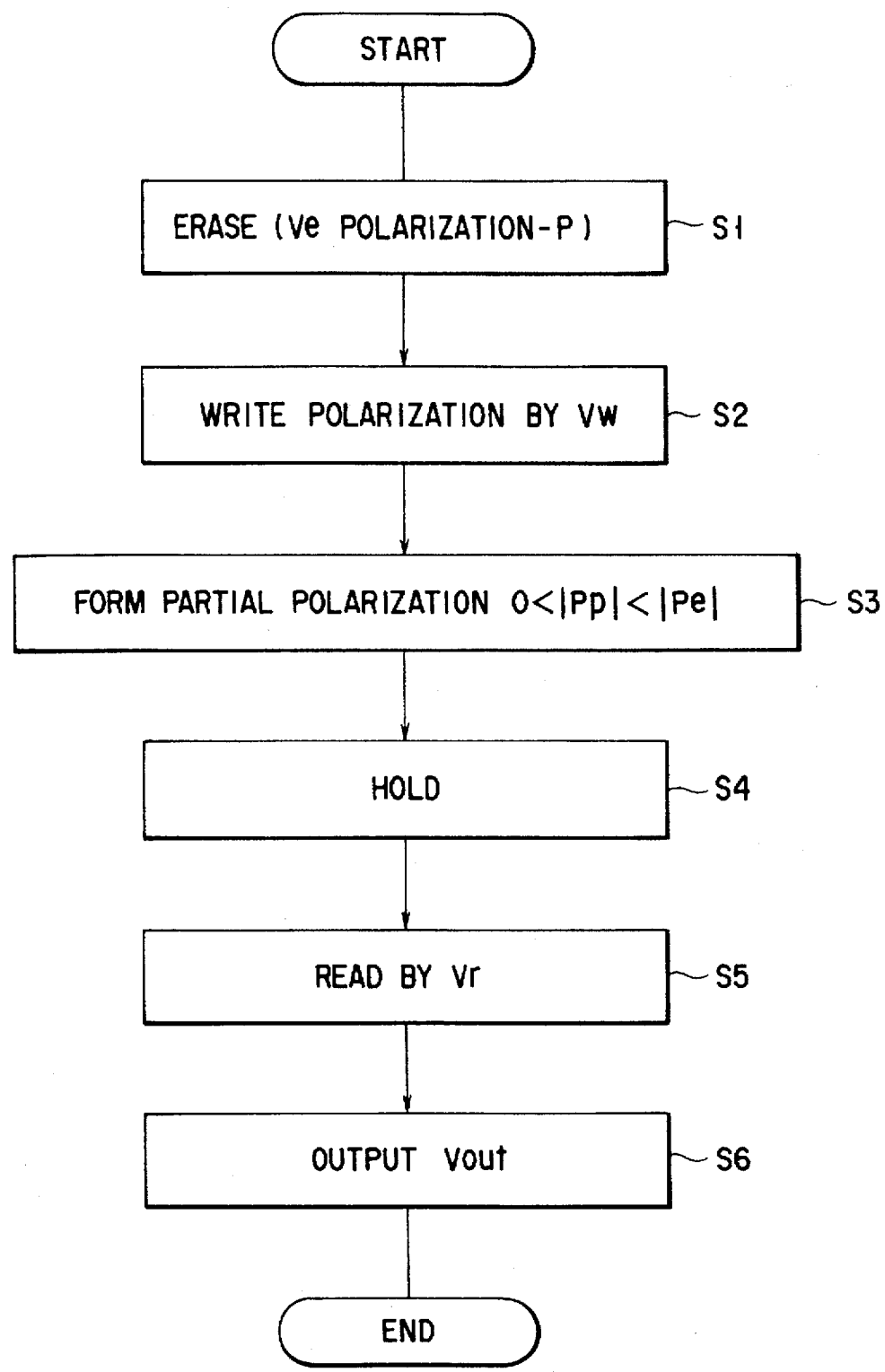
F I G. 9

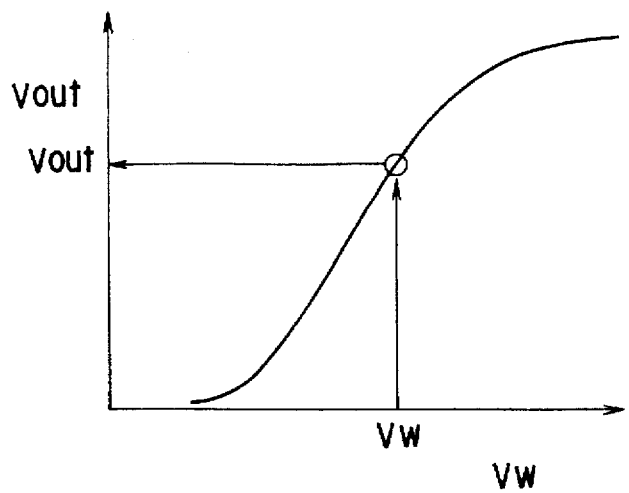
F I G. 13
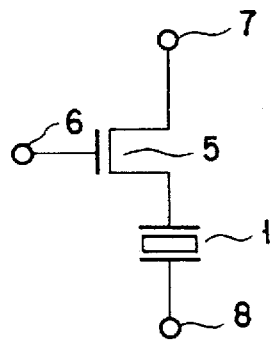
F I G. 14
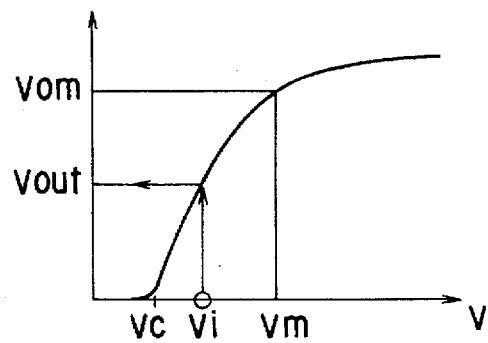
F I G. 15
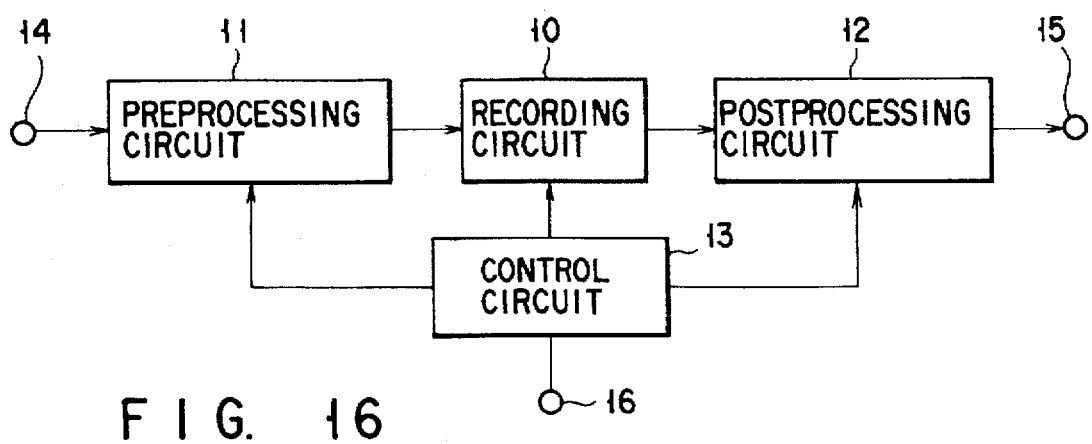
F I G. 16

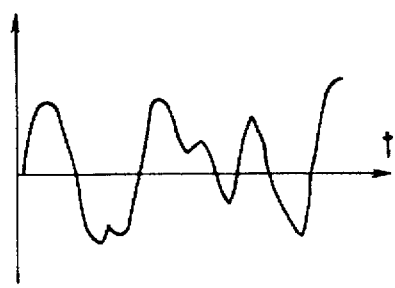
F I G. 17A
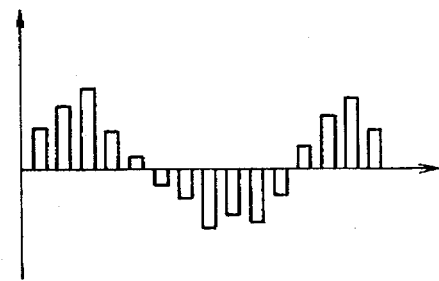
F I G. 17B
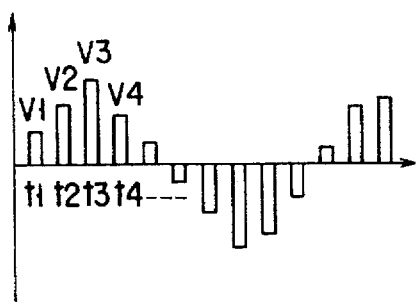
F I G. 18A
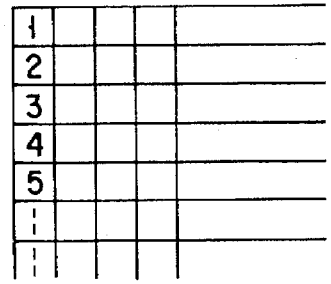
F I G. 18B
F I G. 18C 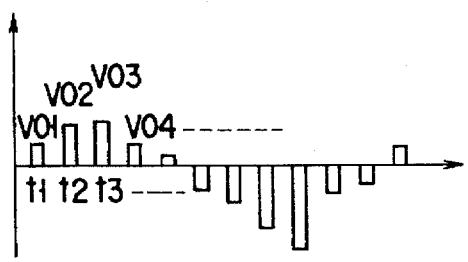
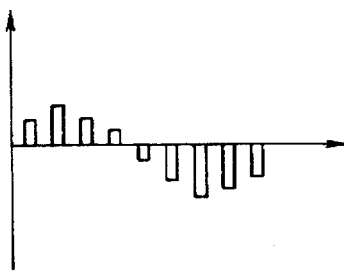
F I G. 19A
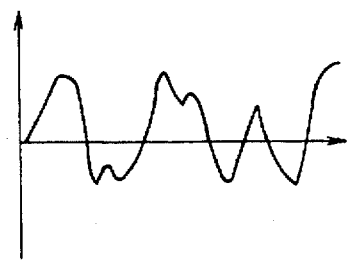
F I G. 19B

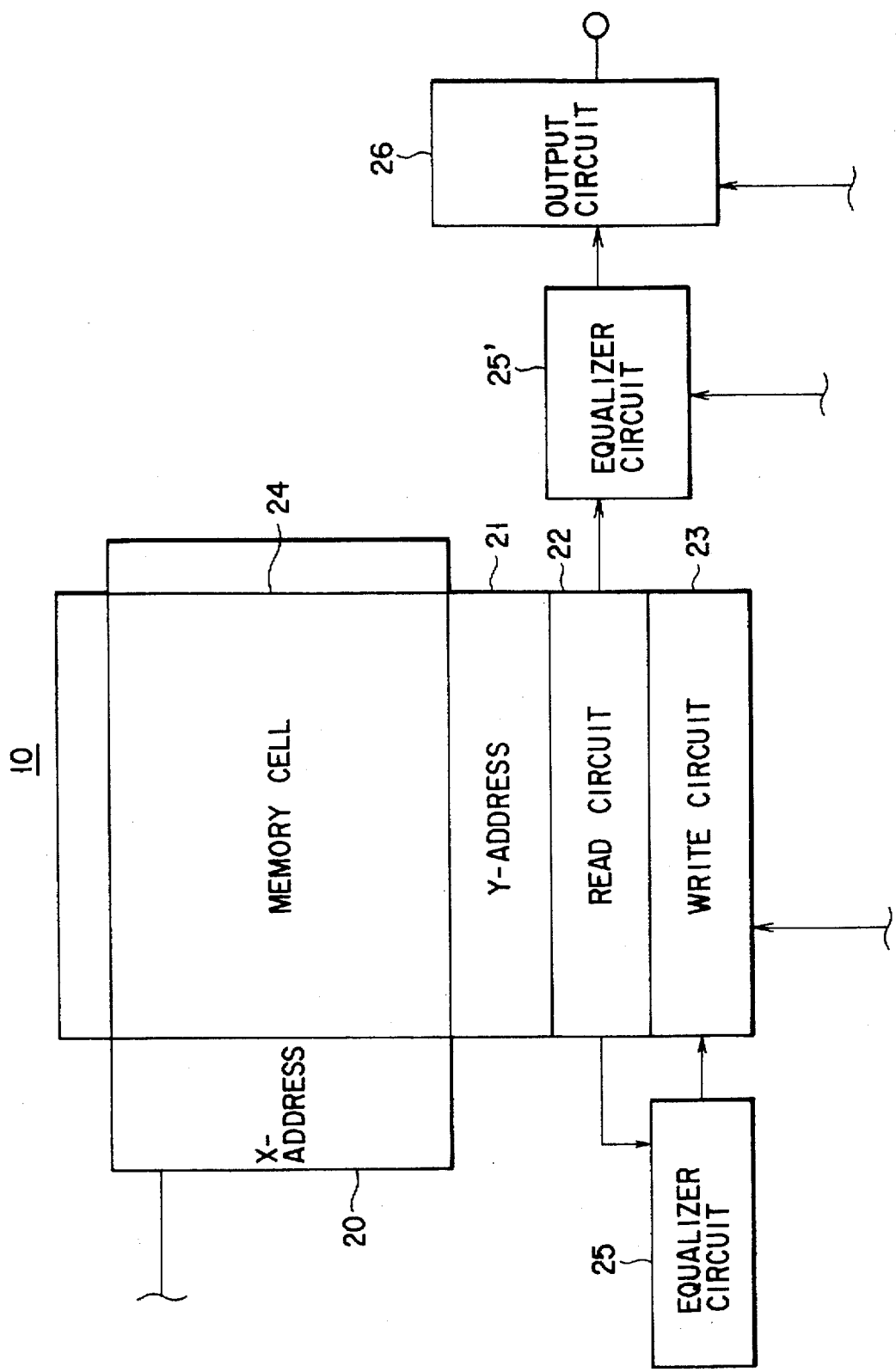
F I G. 21

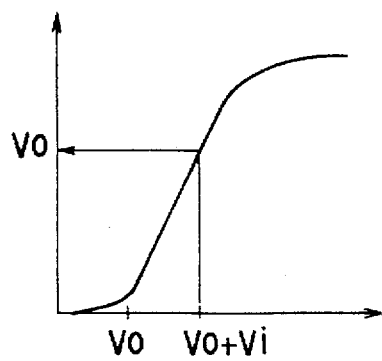
FIG. 22A
| Vi | Vo |
|---|---|
| 0.1 | 0.02 |
| 0.2 | 0.035 |
| 0.3 | 0.04 |
| 0.4 | 0.05 |
| ⋯ | ⋯ |
| 3.0 | 0.60 |
FIG. 22B
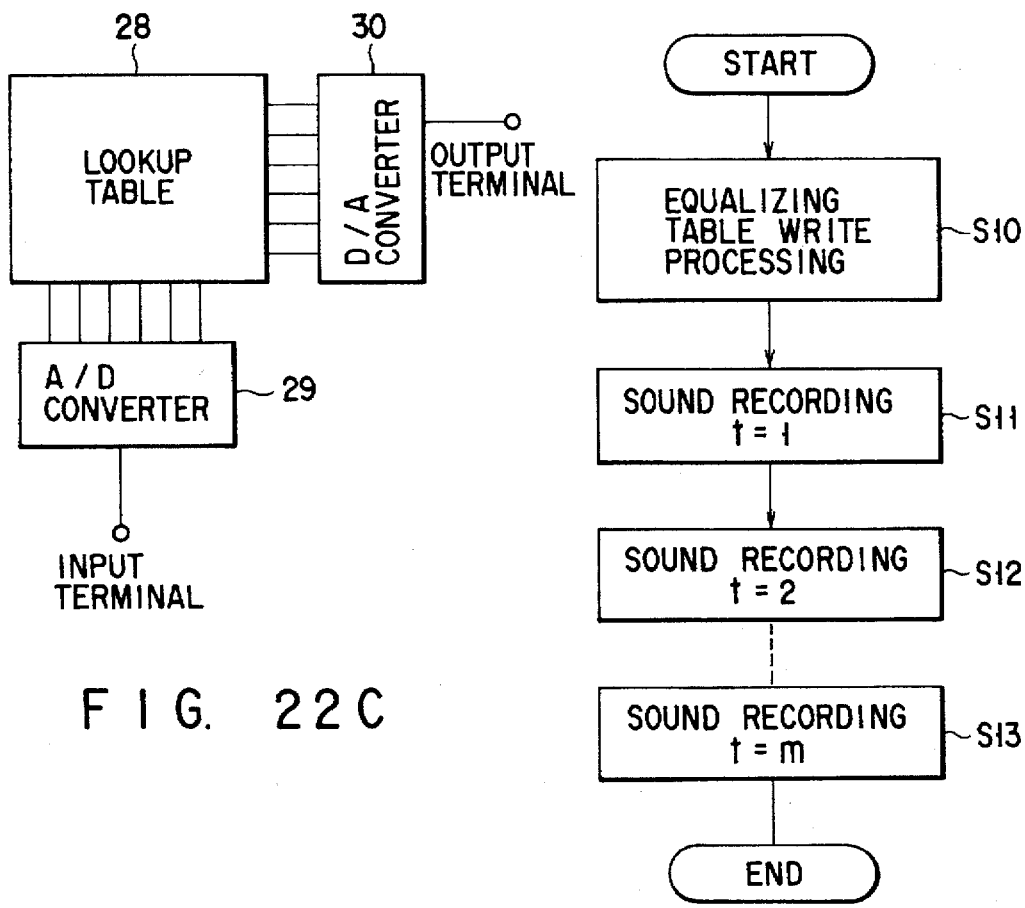
FIG. 22C
FIG. 23

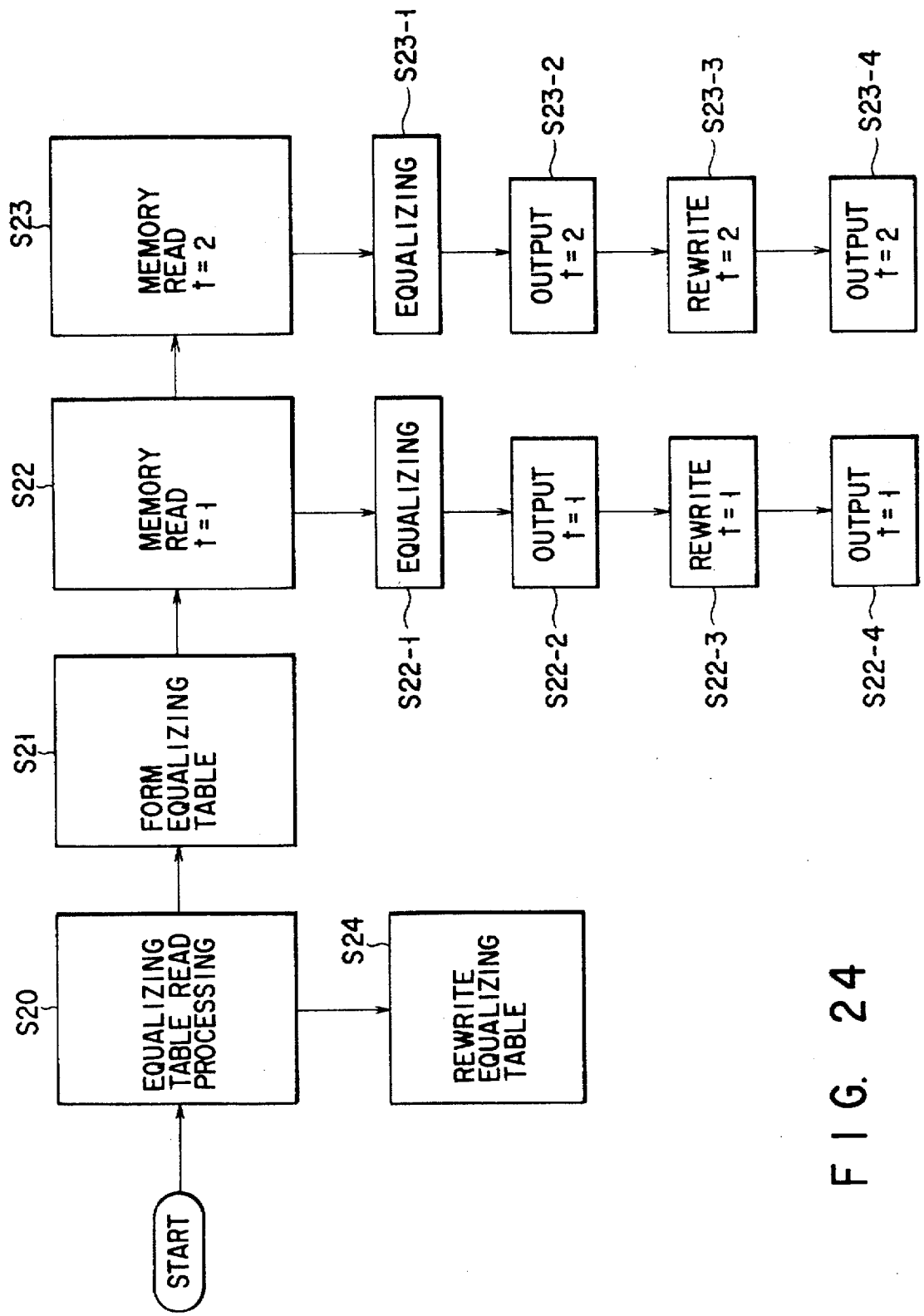
F I G. 24

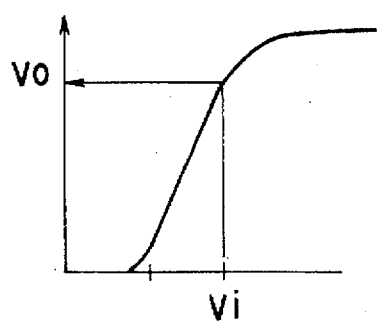
FIG. 25A
| Vi | Vo |
|---|---|
| 0.1V | 0.02 |
| 0.2V | 0.03 |
| 0.3V | 0.04 |
| ⟩ | ⟩ |
| 3.0V | 1.0V |
FIG. 25B
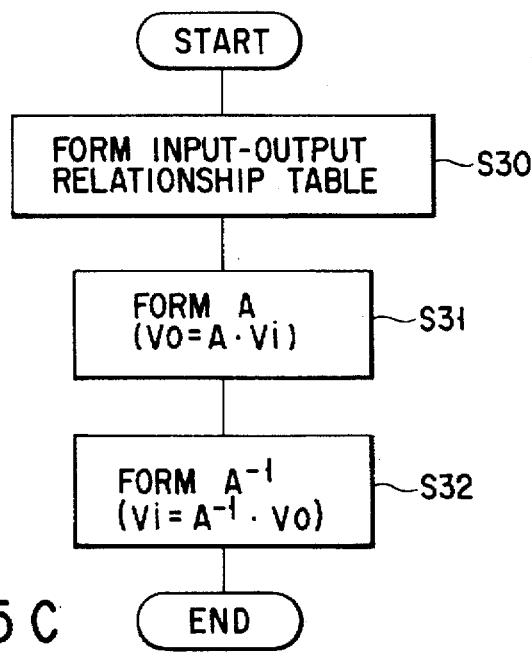
FIG. 25C
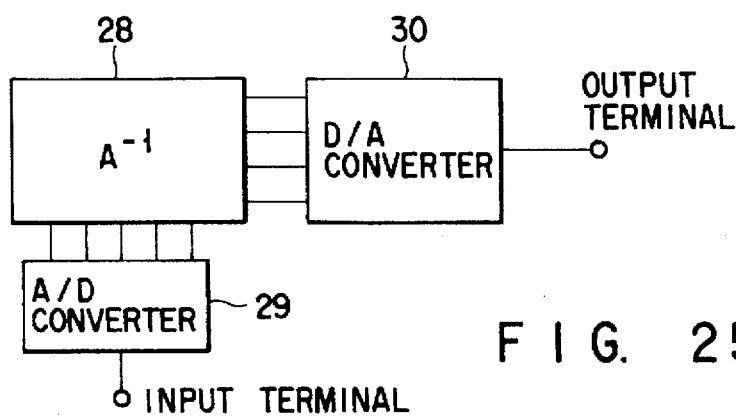
FIG. 25D

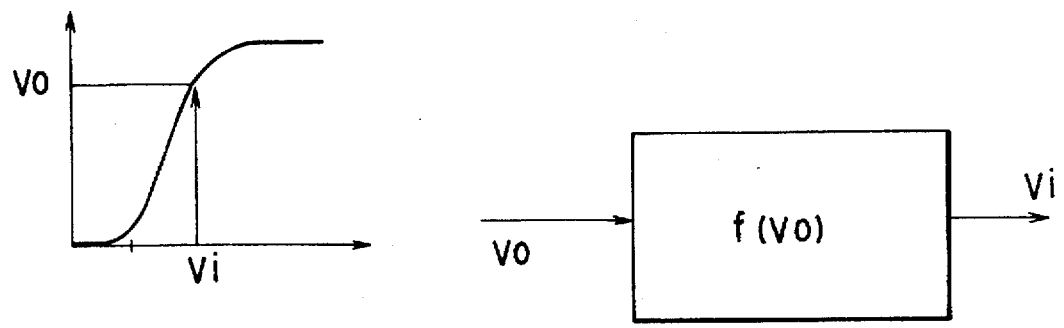
F I G. 26A　　F I G. 26B
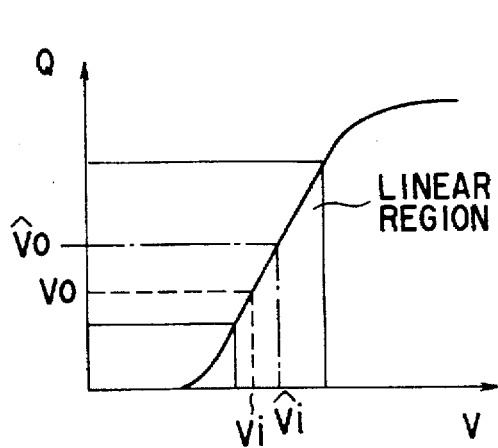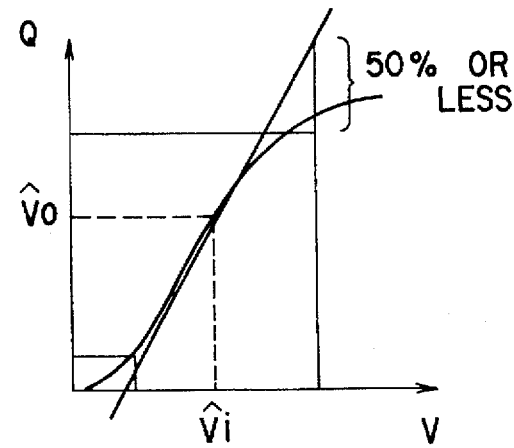
F I G. 27A　　F I G. 27B

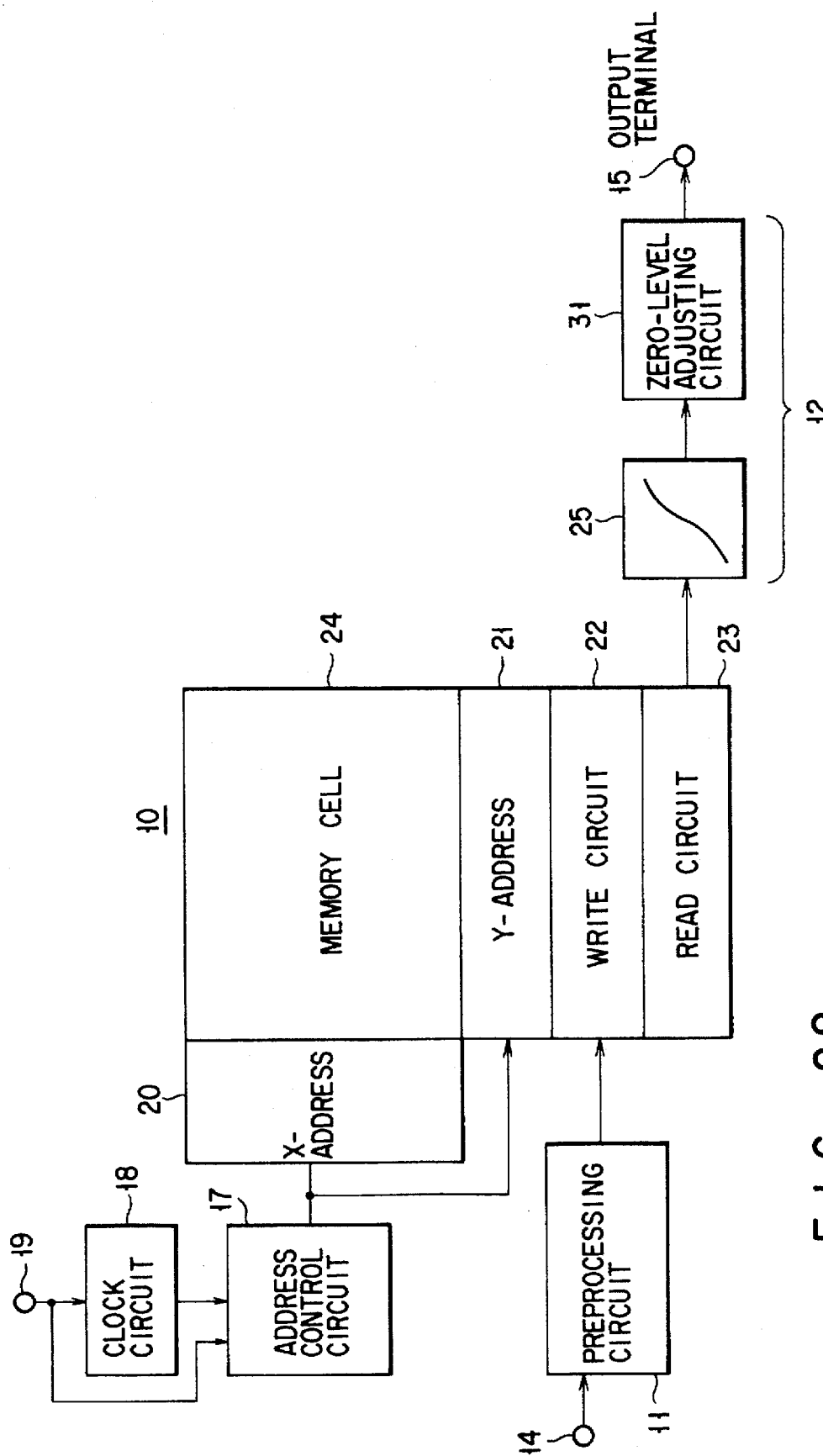
F I G. 28

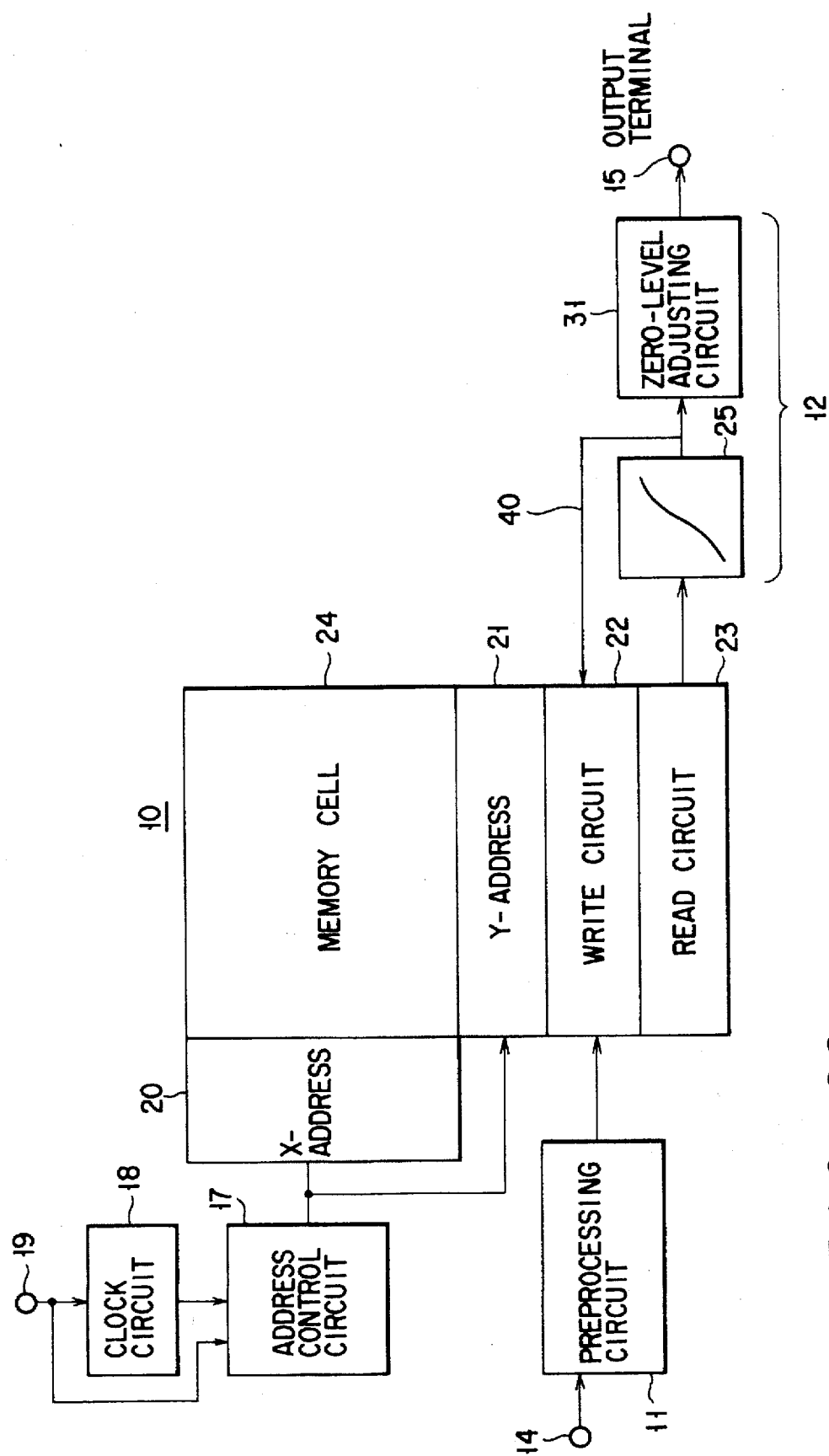
F I G. 29

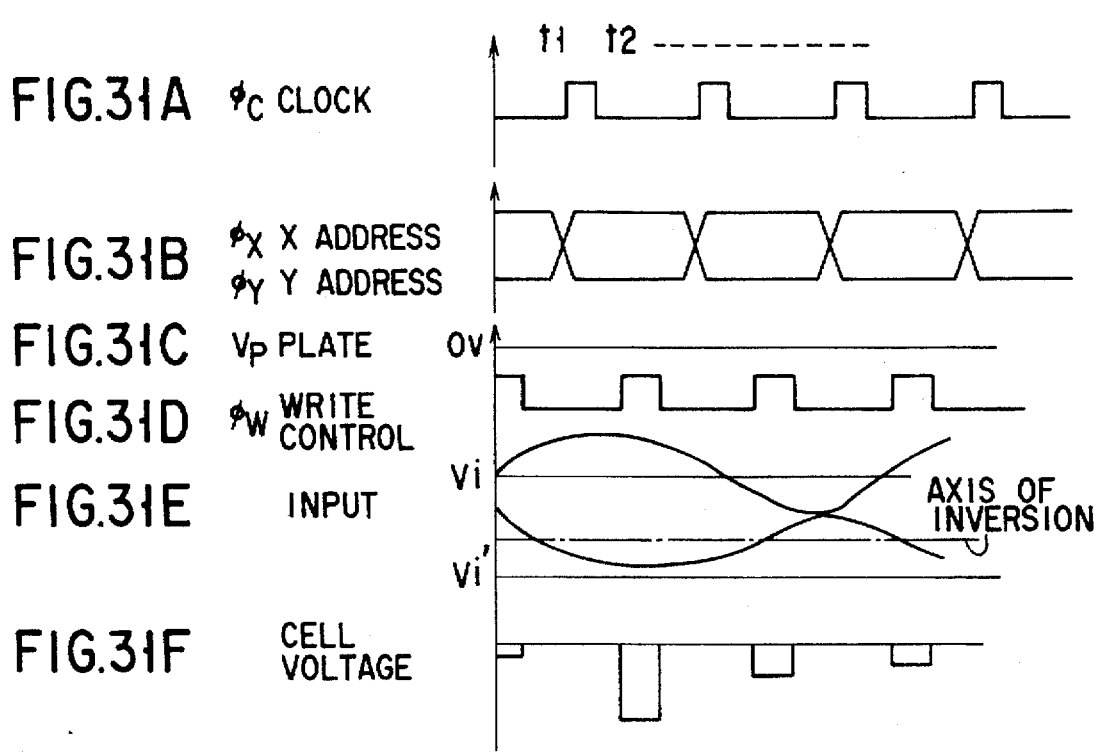
FIG.31A φ_C CLOCK
FIG.31B φ_X X ADDRESS / φ_Y Y ADDRESS
FIG.31C V_P PLATE
FIG.31D φ_W WRITE CONTROL
FIG.31E INPUT
FIG.31F CELL VOLTAGE
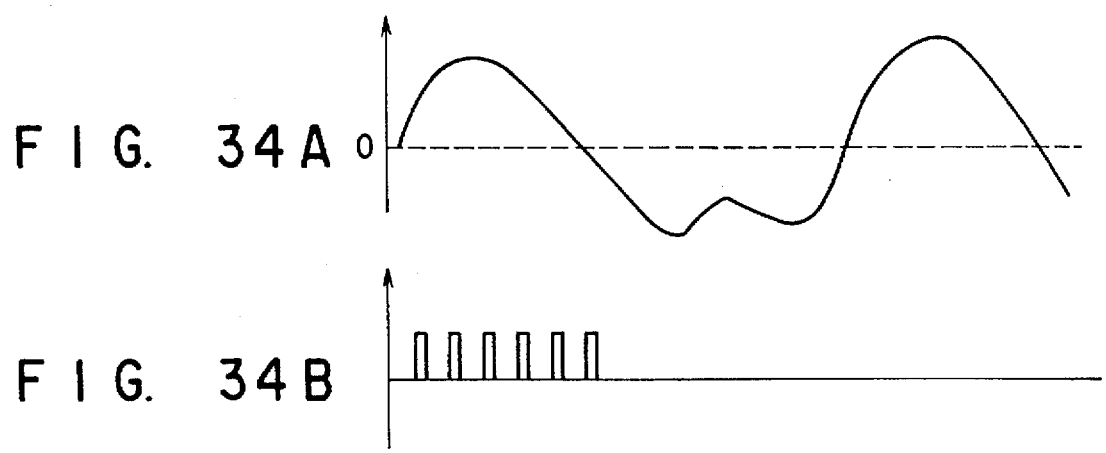
FIG. 34A
FIG. 34B FIG.32A ϕc CLOCK 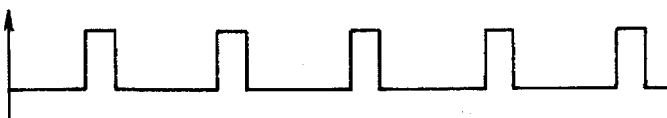
FIG.32B ϕx X ADDRESS
ϕy Y ADDRESS 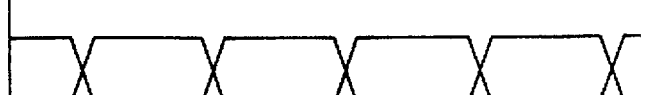
FIG.32C Vp PLATE 
FIG.32D ϕg DATA LINE DISCHARGE PULSE 
FIG.32E ϕr SENSE CIRCUIT ACTIVE 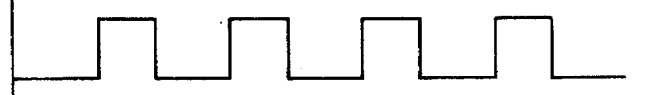
FIG.32F Vo OUTPUT SIGNAL 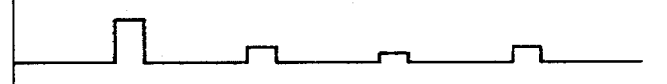
TIME
FIG.32G Vo' 
FIG.32H Vo 

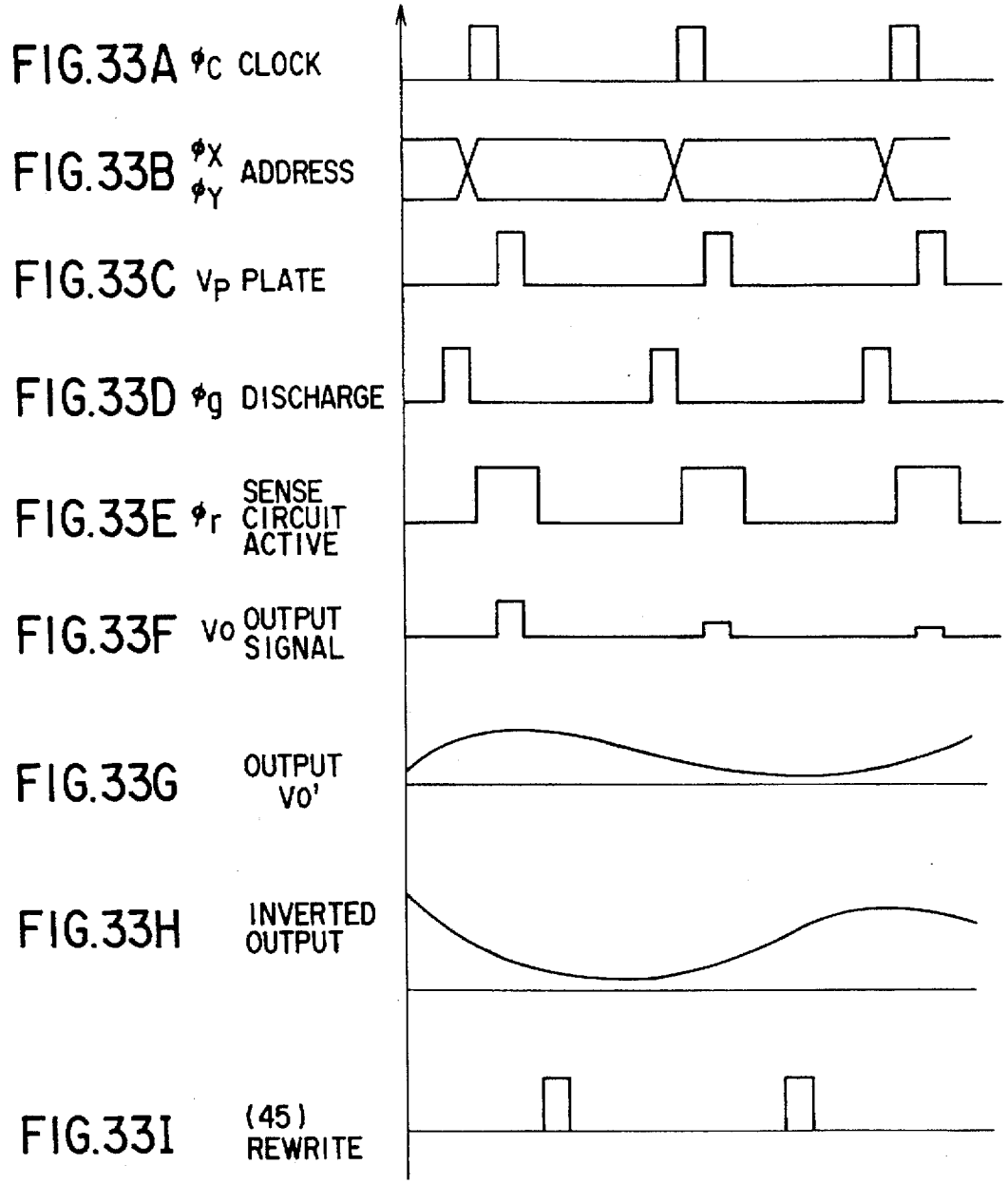

PD: POWER DOWN
P/R̄: PLAYBACK / RECORD
EOM̄: END OF MESSAGE

FERROELECTRIC MEMORY AND RECORDING DEVICE USING THE SAME

BACKGROUND OF THE INVENTION

1. Field of the Invention

The present invention relates to a solid-state recording device used in an electronic circuit.

2. Description of the Related Art

The recent technologies of transmitting and recording sounds and images are essential technologies in the future multimedia systems. These technologies cannot be realized without using a so-called digital signal processor (DSP), a semiconductor recording device (memory), and a high-density external recording device. Since both sounds and images are recorded by once converting analog signals into digital signals, an extremely large memory is necessary to record sounds and images with a high quality. Although this commonly requires certain compression processing, high compression degrades the quality of sounds and images.

Digital recording requires a very complicated manipulation of once converting analog information into digital information, converting and compressing the digital information by DSP, recording the compressed data, and performing D/A conversion for the recorded data. Therefore, it is difficult to incorporate digital recording in inexpensive apparatuses.

As a method of solving this problem, U.S. Pat. No. 4,890,259 has disclosed a method by which, as shown in FIG. 35, sounds are recorded and reproduced by recording analog information in EEPROM cells consisting of floating gate type transistors.

Also, methods of recording analog signals in a ferroelectric memory circuit consisting of ferroelectric elements are proposed. For example, Japanese Patent Publication No. 2-185789 has disclosed a configuration of analog recording using a ferroelectric element as a gate as illustrated in FIG. 36.

In addition, U.S. Pat. No. 5,262,983 has disclosed a method shown in FIGS. 37 and 38 which detects a capacitance change caused by a space charge by recording analog information in a ferroelectric element.

As described above, U.S. Pat. No. 4,890,259 has disclosed the method shown in FIG. 35 which records and reproduces sounds by recording analog information in EEPROM cells. Unfortunately, this method has the following two problems.

(1) An EEPROM cell based on a floating gate is originally unsuitable for analog recording since recording is performed by tunneling or injecting electrons through or into an oxide film between the floating gate and a diffusion layer. Therefore, the conventional techniques perform a number of write actions while monitoring an output current and keeps writing until a necessary analog amount is obtained. This limits the sound band of writing. In addition, since the number of possible write operations of an EEPROM is about $10^5$, the number of write actions of a whole chip is limited to 1000 if one write action needs to be performed 100 times.

(2) A floating gate basically requires a write voltage of 20 V or higher. Although a chip incorporates a boosting circuit in practice, this voltage acts as a large noise source or leads to a high consumption power. Also, it is technically very difficult to battery-drive a chip with a voltage of 1 to 2 V.

The conventional methods of recording analog signals in a ferroelectric memory circuit consisting of ferroelectric elements have many problems. As an example, Japanese Patent Publication No. 2-185789 has disclosed the configuration of analog recording using a ferroelectric material as a gate as shown in FIG. 36. However, it is almost impossible to decrease the interface state density between a ferroelectric material and Si to be as low as that between Si and $SiO_2$. Accordingly, it is not easy to stack a ferroelectric material on a semiconductor such as Si.

U.S. Pat. No. 5,262,983 shown in FIGS. 37 and 38 detects a capacitance change caused by a space charge by recording analog information in a ferroelectric material. To detect a change in the polarization amount, a voltage equivalent to a coercive electric field is applied with a sufficient time constant, and the capacitance is read with a high-frequency voltage. The problems of this method are that the obtained change in the capacitance is small, the nonlinearity of the obtained signal is strong, and the state of the ferroelectric material changes during a read operation when the voltage equivalent to the coercive electric field is applied with a sufficient time constant.

SUMMARY OF THE INVENTION

The present invention has been made in consideration of the above situation, and has as its object to provide a ferroelectric memory by which write and read operations of analog signals can be stably performed for long periods of time, and a recording device using this ferroelectric memory.

To achieve the above object, a ferroelectric memory having a thin ferroelectric film sandwiched between a pair of electrodes as a memory cell according to the first aspect comprises first pulse applying means for applying a first pulse having a voltage Ve higher than a coercive voltage Vc of the thin ferroelectric film to the memory cell, thereby forming a polarized state in a first direction of two states of polarization, second pulse applying means for applying to the memory cell a second pulse having a voltage Vw whose polarity is opposite to a polarity of the first pulse applied by the first pulse applying means, thereby forming a partially polarized state containing both domains having polarization in the first direction and domains having polarization in a second direction opposite to the first direction, and analog recording means for performing analog recording by controlling the partially polarized state by using the second pulse applied by the second pulse applying means.

A ferroelectric recording device according to the second aspect comprises an input terminal for inputting an analog signal of a sound or an image, preprocessing means for converting the input analog signal from the input terminal, a ferroelectric memory region constituted by a memory cell using a thin ferroelectric film to record an output analog signal from the preprocessing means, postprocessing means for processing an output signal from the ferroelectric memory region so that the output signal is equalized to the input signal, an output terminal for selectively extracting an output signal from the postprocessing means to the outside, and control means for selectively controlling the preprocessing means, the ferroelectric memory region, and the postprocessing means.

A ferroelectric recording device according the third aspect comprises an input terminal for inputting an analog signal of a sound or an image, preprocessing means for converting the input analog signal from the input terminal, a ferroelectric memory region constituted by a memory cell using a thin ferroelectric film to record an output analog signal from the preprocessing means, postprocessing means for processing an output signal from the ferroelectric memory region so that the signal is equalized to the input signal, an output terminal for extracting an output signal from the postprocessing means to the outside, control means for selectively controlling the preprocessing means, the ferroelectric memory region, and the postprocessing means, at least one terminal for controlling the control means, a time dividing circuit using a clock circuit, and X- and Y-address circuits and read and write circuits controlled by the time dividing circuit and used to perform data read/write access to the ferroelectric memory region.

BRIEF DESCRIPTION OF THE DRAWINGS

The accompanying drawings, which are incorporated in and constitute a part of the specification, illustrate presently preferred embodiments of the invention and, together with the general description given above and the detailed description of the preferred embodiments given below, serve to explain the principles of the invention.

FIG. 1 is a view showing the structure of a ferroelectric capacitor in the first embodiment;

FIG. 2 is a graph for explaining the hysteresis characteristics of the ferroelectric capacitor;

FIG. 3 is a graph showing the relationships between the charge amount and the applied voltage for a saturation polarization amount Ps and a residual polarization amount Pr;

FIG. 4A is a view showing a configuration for generating a pulse to be applied to the ferroelectric capacitor, and FIG. 4B is a view showing a pulse waveform generated by a pulse generating circuit;

FIGS. 5A and 5B are views for explaining the way apartially polarized state is formed in a thin ferroelectric film by application of pulses;

FIG. 6 is a graph showing a region of partial polarization actually formed;

FIG. 7 is a graph showing the relationship between the applied pulse and the partially polarized state;

FIGS. 8A, 8B, and 8C are views showing a completely polarized state and a partially polarized state;

FIG. 9 is a flow chart for explaining a procedure of applying partial polarization to an analog memory;

FIG. 13 is a graph showing a memory input-output characteristic;

FIG. 14 is a circuit diagram showing the basic configuration of a memory cell when a ferroelectric capacitor is applied to an analog memory;

FIG. 15 is a graph showing the characteristic of an analog output;

FIG. 16 is a block diagram showing the configuration of the second embodiment;

FIGS. 17A and 17B are graphs showing the waveforms of an input signal and an output signal, respectively, in the third embodiment;

FIGS. 18A, 18B, and 18C are views showing the waveform of a recorded signal, the correspondence between memory cells, and the waveform of a readout signal, respectively, in the third embodiment;

FIGS. 19A and 19B are graphs showing the waveform of an input signal to an equalizer and the waveform of a chip output;

FIG. 21 is a block diagram showing the whole configuration of the fifth embodiment;

FIGS. 22A to 22C are views showing the configuration of the sixth embodiment;

FIG. 23 is a flow chart for explaining write processing in the seventh embodiment;

FIG. 24 is a flow chart for explaining read processing in the seventh embodiment;

FIGS. 25A to 25D are views for explaining the eighth embodiment;

FIGS. 26A and 26B are views for explaining a modification of the eighth embodiment;

FIGS. 27A and 27B are graphs for explaining the ninth embodiment;

FIG. 28 is a block diagram showing the configuration of the 10th embodiment;

FIG. 29 is a block diagram showing the configuration of the 11th embodiment;

FIGS. 31A to 31F are timing charts for explaining the 13th embodiment;

FIGS. 32A to 32H are timing charts for explaining the 14th embodiment;

FIGS. 33A to 33I are timing charts for explaining the 15th embodiment;

FIGS. 34A and 34B are timing charts for explaining the 16th embodiment;

DETAILED DESCRIPTION OF THE PREFERRED EMBODIMENTS

Figure 10:
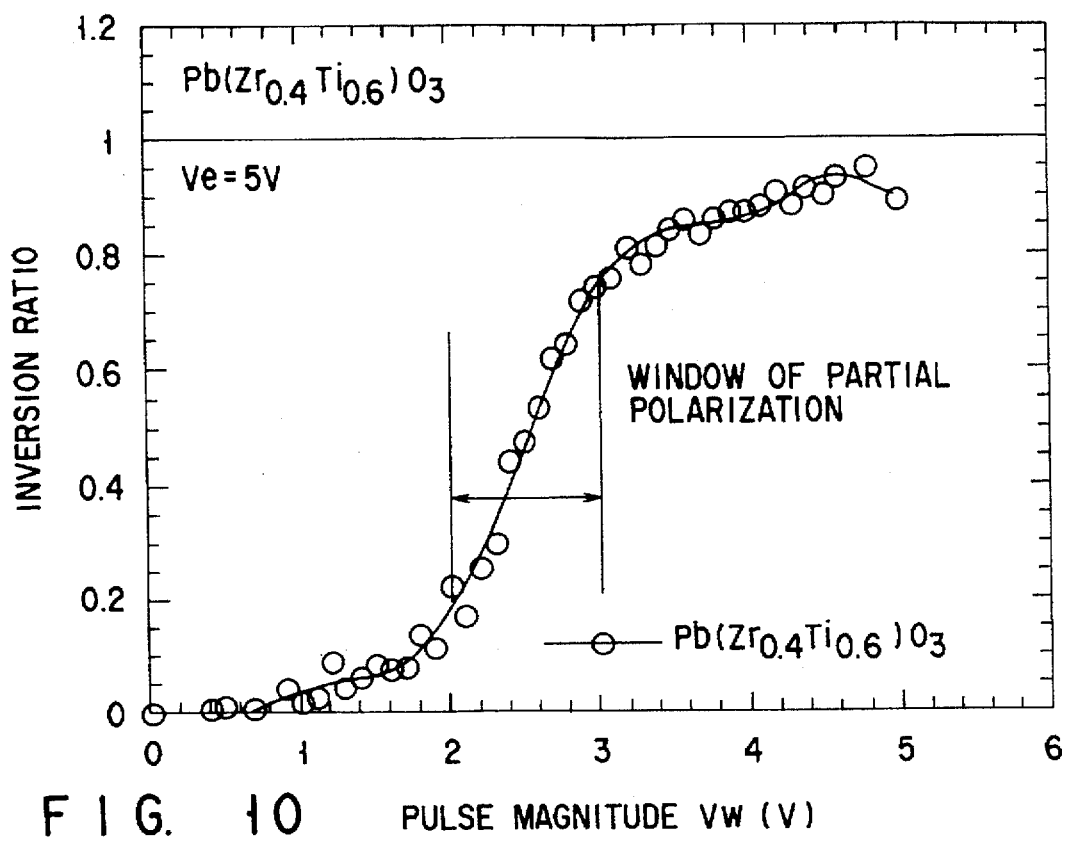
FIG. 10 is a graph showing the relationship between the polarization inversion ratio and the pulse magnitude.

Embodiments of the present invention will be described in detail below with reference to the accompanying drawings.

The first embodiment of the present invention will be described below. The purpose of the first embodiment is to realize a ferroelectric analog memory for recording analog values of sounds or images by making an arbitrary charge amount or voltage amount to correspond to a partially polarized state obtained by a method explained below. A multivalue memory can be constituted by appropriately selecting a write value.

The method of obtaining a partially polarized state will be described below. FIG. 1 shows the structure of a ferroelectric capacitor 1 consisting of two electrodes Pt made from, e.g., platinum, and a thin ferroelectric film Fm sandwiched between these electrodes Pt. When a predetermined voltage is applied to the two electrodes Pt, the polarization amount of the thin ferroelectric film Fm nonlinearly changes in accordance with the applied voltage, resulting in a hysteresis characteristics as shown in FIG. 2. These hysteresis characteristics are usually measured by using a continuous sine wave of about 1 kHz or a triangular wave. In FIG. 2, Pr indicates a residual polarization amount and Ps indicates a saturation polarization amount.

FIG. 3 shows the relationships between the charge amount and the applied voltage for the saturation polarization amount Ps and the residual polarization amount Pr. The difference between the saturation polarization amount Ps and the residual polarization amount Pr is called back switching. Vc' is a coercive voltage obtained from the hysteresis characteristics, and Vc is a coercive voltage obtained from the Pr-V characteristic. As in FIG. 3, Vc' and Vc are not necessarily equal. (I) indicates a region of a polarized state in which polarization is set in a first direction by a first pulse Ve (to be described later). When a second pulse Vw (to be described later) is applied in this state (I), the state (I) transits to a region (III) in which a polarized state almost inverted in a second direction is obtained. In this region, no polarization inversion occurs, i.e., the polarization does not change. (II) indicates a region of partial polarization. Partial polarization is a polarized state having a mixture of the polarization in the first direction and the polarization in the second direction (FIGS. 5A and 5B).

A method of forming the partial polarization by using a single pulse will be described below. As shown in FIG. 4A, a thin ferroelectric film Fm is sufficiently, negatively polarized with a first pulse which is generated by a pulse generating circuit 2 connected to a ferroelectric capacitor 1 and has a pulse width We and a magnitude Ve as shown in FIG. 4B. A second pulse having a magnitude Vw and a pulse width Ww which is not less than five times a switching time ts of the thin ferroelectric film Fm is applied. As a result, a partially polarized state as described below is formed.

FIG. 5A shows a completely polarized state, and FIG. 5B shows the way a partially polarized state is formed. P indicates polarization. Since an actual ferroelectric material takes a domain structure in a fine crystal, the polarization P takes a complicated domain structure depending on the crystal orientation of each grain and the direction of an electric field. In FIGS. 5A and 5B, a simplified domain structure is illustrated for the sake of easy understanding, and the polarization is averaged in a direction (indicated by the arrows) perpendicular to the direction of film thickness.

FIG. 6 shows a region (crosshatched region) of partial polarization actually formed. This partial polarization region can be controlled by changing the pulse width Ww (time tw) and the magnitude Vw of the second pulse and extremely stably exists even after the application of the second pulse. The absolute value of the magnitude Vw of the second pulse is 0.3 to 2 times, preferably 0.3 to 1.5 times the coercive voltage Vc of the thin ferroelectric film Fm. The relationship between the magnitude Ve (absolute value) of the first pulse and the magnitude Vw (absolute value) of the second pulse is Vw≦Ve. The pulse width Ww of the second pulse is 1% to 300% of the pulse width We of the first pulse and preferably satisfies Ww≦We. Consequently, it is possible to form a stable partially polarized state in which the polarization amount of partial polarization is 10% to 90% of the polarization amount of the first polarized state.

Details of analog recording using this partially polarized state will be described below. FIG. 7 shows a change in the polarized state, i.e., the write voltage dependence of the total polarization P, when a write operation is performed while the write voltage Vw is changed in the partially polarized state formed by the method described above. FIGS. 8A, 8B, and 8C illustrate three representative states at points a, b, and c, respectively, in FIG. 7. FIG. 8A shows a downward completely polarized state, FIG. 8C shows an upward completely polarized state, and FIG. 8B shows a partially polarized state. At the point b in FIG. 7, it is possible to obtain a partially polarized state which has a polarization amount Pp corresponding to the write voltage Vw and is continuous in a hatched region shown in FIG. 7.

A procedure of applying this partial polarization to an analog memory will be described below with reference to FIG. 9. The contents of a memory are erased with the voltage Ve much higher than the coercive voltage (step S1), and a write operation is performed by an arbitrary value Vw between 0 V and Ve (step S2). A partially polarized state Pp is thus formed and held (steps S3 and S4). This state is extremely stable and it turns out that the state can be held for more than ten years at room temperature. Thereafter, the polarization amount is read out with a voltage Vr having almost the same polarity and magnitude as Ve (step S5). The readout polarization amount is obtained as an output voltage Vout (step S6).

Figure 11:
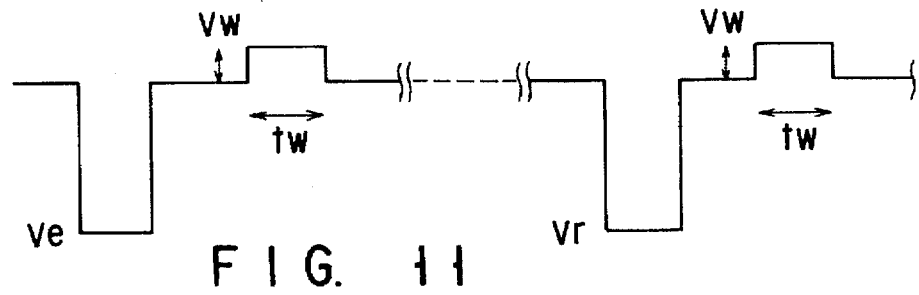
FIG. 11 is a view showing a pulse waveform actually applied.
Figure 12:
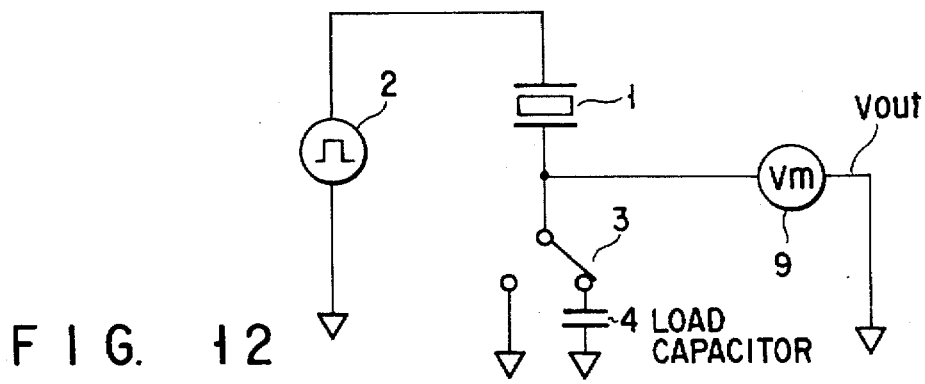
FIG. 12 is a circuit diagram showing a configuration for performing write and read operations.

FIG. 10 shows the result of formation of partial polarization in an actual thin PZT film. In FIG. 10, Ve=Vr=5 V and Vw is changed from 0 to 5 V. The inversion ratio (ordinate) is the ratio of partial polarization when complete polarization is 1. A read operation is performed in accordance with the above-mentioned steps by using a configuration shown in FIG. 12. In this configuration, a pulse generating circuit 2 applies a voltage as shown in FIG. 11 to a ferroelectric capacitor 1. After the contents are erased by applying the voltage Ve, a write operation is performed by the voltage Vw, and the partially polarized state is held. The polarization amount is then read out by a voltmeter 9 by applying the voltage Vr. When the erase operation is performed with Ve and the write operation is performed with Vw, the ferroelectric capacitor 1 is grounded either directly or via a resistor. When the read operation is performed with Vr, the ferroelectric capacitor 1 is grounded via a load capacitor 4. This switching is done by operating a switch 3.

FIG. 13 shows the resulting relationship between Vw and Vout, which is called a memory input-output characteristic. Since the partially polarized state is broken when the voltage Vr is applied, the write operation described above is performed by again applying the voltage Vw. The memory input-output characteristic in FIG. 13 is not a one-to-one relationship. The output voltage is about a few mV although it depends upon the load capacitor 4. Also, distortion or a second harmonic is generated due to the nonlinearity of the memory input-output characteristic. To record high-quality analog information, therefore, correction must be performed to approach the output characteristic to the input characteristic. This processing is called equalizing processing.

The purpose of the first embodiment is to practice the ferroelectric capacitor 1 as an analog memory. FIG. 14 shows the basic configuration of an analog memory cell. The ferroelectric capacitor 1 is connected to a selector transistor 5 constituted by, e.g., a field-effect transistor (FET). One electrode of the ferroelectric capacitor 1 is connected to the source (drain) of the selector transistor 5, the drain (source) of the selector transistor 5 is connected to a data terminal 7, and a cell selection control signal is input to a gate terminal 6. The other electrode of the ferroelectric capacitor 1 is connected to a plate terminal 8. The selector transistor 5 is unnecessary if the ferroelectric capacitor 1 is properly chosen.

FIG. 15 shows the relationship between an analog input Vi, a recording level Vm, and an output signal Vout. The output Vout is obtained when the analog input Vi is set between the recording level Vm and a coercive voltage Vc.

Any ferroelectric material can be used as long as the material has spontaneous polarization. General examples are those having a perovskite structure such as $Pb(Zr,Ti)O_3$, (Pb,La)(Zr,Ti)$O_3$, PbTi$O_3$, and BaTi$O_3$. Layered compounds can also be used. Examples are SrBi$_2$Ta$_2$O$_9$, SrBi$_2$Nb$_2$O$_9$, SrBi$_4$Ti$_4$O$_{12}$, SrBi(Ta,Nb)$_2$O$_9$, and Bi$_4$Ti$_3$O$_{12}$. Examples of the film formation method are a sol-gel method, an organic metal method, sputtering, and MOCVD, and some other arbitrary method can also be used. The film thickness can be scaled in accordance with an actual driving voltage. For example, when the driving voltage is 5 V, the film thickness is 200 nm to about 1 μm, assuming that the coercive electric field is 30 to 60 kV/cm. When the device is driven with a battery of 1.5 V, the film thickness is 50 nm to about 0.5 μm, assuming the coercive electric field is 30 to 60 kV/cm. The electrode material can be any of a noble metal such as platinum Pt, a conductive oxide, and a combination of these materials.

The ferroelectric analog memory formed by the above method can be written and read at a high speed, can operate with a very low voltage, and can be constituted by a single chip without using any special expensive additional circuit. In particular, still images and short-time moving images can be recorded by utilizing a high speed and a low voltage as the characteristic features of a ferroelectric memory. This memory can be optimally used to store the contents of memorandums in digital portable telephones and toys if the capacity of the memory is small. The memory can also be applied to answering telephones, portable telephones, interphones, and electronic notebooks.

Since sounds can be recorded for 10 to 300 minutes if a large-capacity chip is used, the memory is optimally used in normal recorders. The memory can be particularly, optimally used in editing because read and write operations can be performed at a high speed of 1/100 to 1/10,000 sec. The memory is also highly resistant to erroneous operations because no special data compression is performed in an analog system. As an example, in analog recording, an error of a few bits has almost no influence on the human ear. However, in digital recording, an error of even one bit adversely affects various portions pertaining to data compression.

The second embodiment of the present invention will be described below. In the second embodiment, an input circuit, a control circuit, and an output circuit are added to a ferroelectric memory for performing analog recording, thereby storing sounds or images in one chip. FIG. 16 shows the configuration of the second embodiment. This memory comprises an input terminal 14 for inputting an analog signal of, e.g., sounds or images, a preprocessing circuit 11 for converting the analog signal, a recording circuit 10 which is constituted by memory cells using ferroelectric capacitors 1 and records the analog signal, a postprocessing circuit 12 for processing an output signal from the recording circuit 10 so that the signal becomes equal to the input signal, an output terminal 15 for extracting the output signal to the outside, a control circuit 13 for controlling the preprocessing circuit 11, the recording circuit 10, and the postprocessing circuit 12, and at least one control terminal 16 for controlling the control circuit 13. Although these circuits are independent of each other, they merely represent their respective functions and so one circuit can contain another. For example, the preprocessing circuit 11 can be contained in the recording circuit 10. Also, in this ferroelectric memory, each memory cell in the recording circuit 10 can have a selector transistor. Furthermore, in each memory cell in the recording circuit 10 of this ferroelectric memory, the current control terminal of the ferroelectric capacitor 1 can be connected to the current control terminal of a three-terminal selector transistor added to each memory cell, and a cell selection control signal can be supplied to this current control terminal. The ferroelectric memory can also have a structure in which a field-effect transistor (FET) is used as the selector transistor of each memory cell in the recording circuit 10, one electrode of the ferroelectric capacitor 1 is connected to the source or the drain, and a cell selection control signal is supplied to a gate terminal.

The third embodiment of the present invention will be described below. In this third embodiment, an analog signal is input to a ferroelectric memory for performing analog recording, and this analog signal is recorded in the ferroelectric memory by sampling-and-holding the signal inside a chip. The third embodiment includes a preprocessing circuit 11 for converting an analog signal of, e.g., sounds or images, input to an input terminal 14, by sampling-and-holding the signal in the configuration shown in FIG. 16. FIG. 17A shows the input analog signal, and FIG. 17B shows the sampled-and-held signal.

That is, the preprocessing circuit 11 of the third embodiment divides the input analog signal as shown in FIG. 17A at a preset time interval and converting the signal into a voltage which is held by an analog value triggered by that time, thereby obtaining the signal as shown in FIG. 17B. Any method can be used as the analog value holding method. Examples are sampling-and-holding using a comparator and a switched capacitor.

FIGS. 18A, 18B, and 18C illustrate addressing of the sampled-and-held signal to the time, the state of each address recorded in a memory cell, and the output result. That is, FIG. 18A shows an analog voltage held by an analog value triggered by a preset time interval at which an input analog signal is divided. FIG. 18B shows the correspondence between the voltages and the addresses in memory cells. In FIG. 18B, numbers 1 to 5 correspond to t1 to t5 in FIG. 18A, and V1 to V5 indicate analog values to be recorded. FIG. 18C shows the output result in which output signals obtained in accordance with the memory input-output characteristic, FIG. 13, are arranged in an order of input addresses. This output result contains a voltage difference or distortion.

An analog voltage recorded in each cell of a recording circuit 10 is read out at the time interval at which an input analog signal is divided, and output in real time. This output signal (FIG. 19A) is applied to an equalizer in a postprocessing circuit 12 and corrected. Consequently, a chip output as shown in FIG. 19B is obtained.

In FIG. 16, the postprocessing circuit 12 converts (equalizes) an output analog voltage A from each cell into a voltage level equivalent to an input voltage. The postprocessing circuit 12 has a function of restoring an original output value since an output signal changes its value when stored in a ferroelectric analog memory cell.

Figure 20:
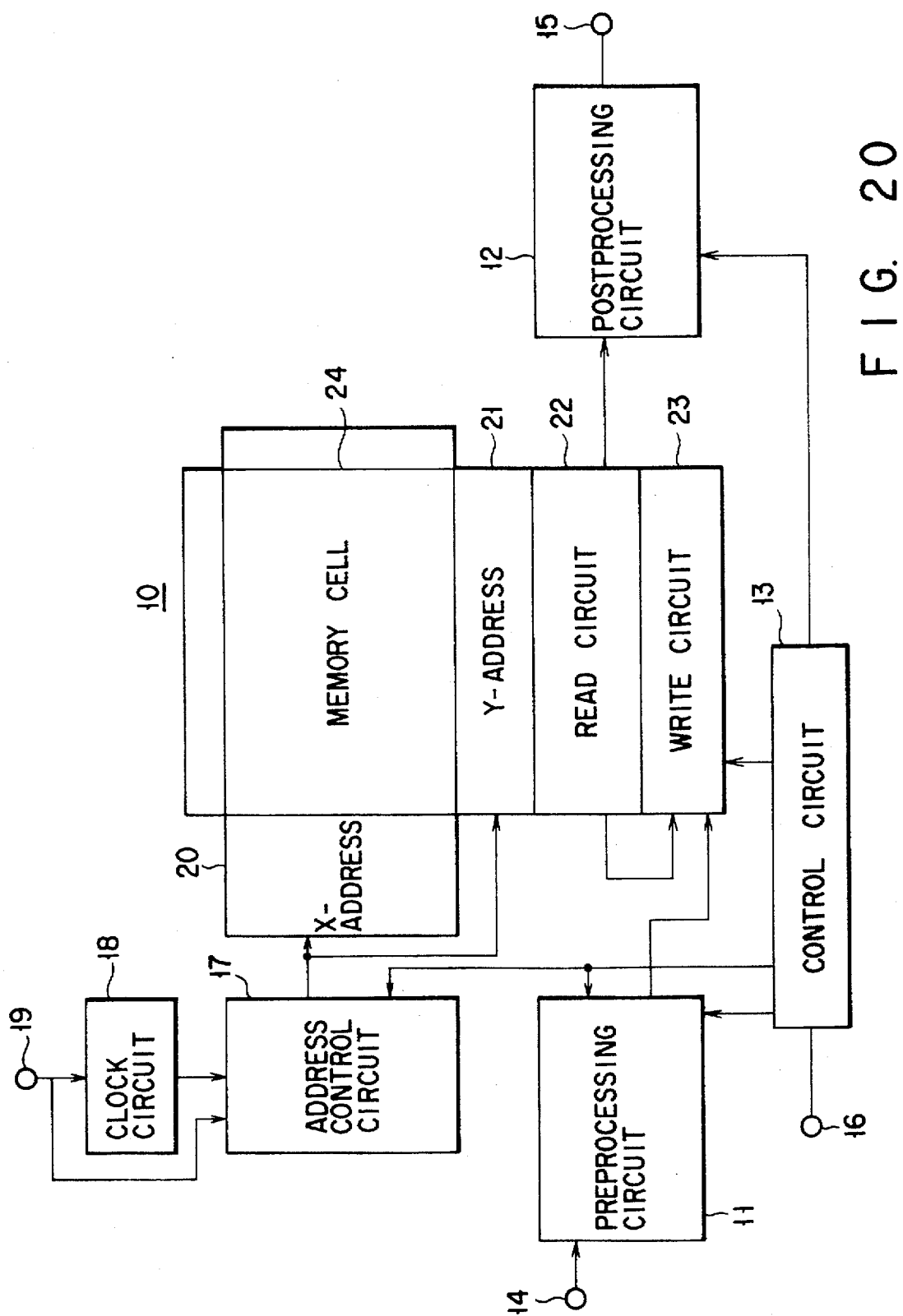
FIG. 20 is a block diagram showing the configuration of the fourth embodiment.

The fourth embodiment of the present invention will be described below. FIG. 20 is a block diagram showing the whole configuration of the fourth embodiment. This recording device comprises an input terminal 14 for inputting an analog signal of, e.g., sounds or images, an input signal preprocessing circuit 11, a recording circuit 10 for recording the analog signal, a postprocessing circuit 12 for processing an output signal from the recording circuit 10 so that the signal becomes equal to the input signal, an output terminal 15 for extracting this output signal to the outside, a control circuit 13 for controlling the preprocessing circuit 11, the recording circuit 10, and the postprocessing circuit 12, at least one control terminal 16 for controlling the control circuit 13, a clock circuit 18, and an address control circuit 17 for performing address control by using clocks generated by the clock circuit 18.

The recording circuit 10 includes a memory cell 24, X- and Y-address circuits 20 and 21 controlled by the address control circuit 17, a read circuit 22, and a write circuit 23.

The input signal preprocessing circuit 11 can be incorporated into the recording circuit 10 for recording an analog signal. The clock circuit 18 can be either externally supplied or internally generated. Also, the preprocessing circuit 11 or the postprocessing circuit 12 can be omitted or can be a simple impedance converting circuit.

The fifth embodiment of the present invention will be described below. FIG. 21 is a block diagram showing the whole configuration of the fifth embodiment. In this fifth embodiment, equalizer circuits 25 and 25' are additionally provided between a read circuit 22, a write circuit 23, and an output circuit 26 in the configuration of the fourth embodiment shown in FIG. 20. A signal read out from the memory is converted and rewritten by the write circuit 23. Alternatively, the signal is output to the output circuit 26. The equalizer circuits 25 and 25' can be identical to each other. The equalizer circuit 25 can also be arranged after the read circuit 22 to convert an output signal from the memory into a signal equivalent to an input signal. Alternatively, the equalizer circuit 25 can be arranged between the output of a memory cell 24 and the output terminal of the memory device to set the voltage level of a memory output to a necessary level by using a signal equivalent to an input signal.

The sixth embodiment of the present invention will be described below. FIGS. 22A, 22B, and 22C are views for explaining the sixth embodiment. FIG. 22A is a graph showing a memory input-output relationship. FIG. 22B is a table showing the memory input-output relationship by using numerical values. FIG. 22C shows the configuration of the lookup table.

As shown in FIG. 13, the relationship between the input voltage and the output voltage of a memory cell using a thin ferroelectric film is not linear. "Linear" means that the input function and the output function are in a proportional relationship multiplied by a coefficient. Therefore, problems such as distortions and harmonics having influences on the quality of a signal occur. Accordingly, an equalizing circuit for correcting a memory output is necessary.

In the sixth embodiment, therefore, this equalizing circuit is arranged between the output of a memory cell and the output terminal of a memory device. A lookup table 28 related to an analog operation is formed in accordance with the input-output relationship of an analog signal previously written in a ferroelectric memory cell. An equalized output is obtained by inputting the output signal to the lookup table 28. This lookup table is a correspondence table by which one output signal is determined for one input signal. In the sixth embodiment, an A/D converter 29 and a D/A converter 30 are arranged in the input and output portions, respectively, of the lookup table 28. However, these circuits are not necessarily used.

The sixth embodiment can be modified as follows. That is, an equalizer circuit is arranged between the output of the memory cell and the output terminal of the memory device and forms a lookup table of a digital operation in accordance with the input-output relationship of an analog signal previously written in the ferroelectric memory cell. The output signal is A/D-converted by the A/D converter 29, input to the lookup table 28, and D/A-converted by the D/A converter 30. Consequently, an equalized output can be obtained.

The seventh embodiment of the present invention will be described below. FIGS. 23 and 24 are views for explaining the seventh embodiment. FIG. 23 shows write processing, and FIG. 24 shows read processing. As shown in FIG. 13, the relationship between the input voltage and the output voltage of a memory cell using a thin ferroelectric film is not linear. "Linear" means that the input function and the output function are in a proportional relationship multiplied by a coefficient. Therefore, problems such as distortions and harmonics having influences on the quality of a signal occur. Accordingly, an equalizing circuit for correcting a memory output is necessary. Correction data needs to be formed each time a read operation is performed since the above-mentioned nonlinear characteristic changes in accordance with the use environment such as the temperature or the time after a write operation as well as the formation method of a ferroelectric material or variations in materials. In this seventh embodiment, therefore, as shown in FIG. 23, after a certain amount of information is written (steps S10 to S13), an equalizing table is formed each time the information is read out so that an equalized output is obtained by using the equalizing table when the information is read out (steps S20 to S24).

Note that it is possible to perform the preprocessing of forming an equalizing table before a memory recording operation is performed and obtain an equalized output by using the equalizing table when a read operation is performed. Also, as shown in FIG. 24, it is possible to form an equalizing table before a memory read operation is performed and obtain an equalized output by using the equalizing table when a read operation is performed. As shown in FIG. 24, in the formation of an equalizing table, an equalizing cell provided in the same chip and having the same configuration as a recording ferroelectric cell can be used. This equalizing cell can be the same as the recording ferroelectric cell.

The eighth embodiment of the present invention will be described below. FIGS. 25A, 25B, 25C, and 25D are views for explaining the eighth embodiment. FIG. 25A shows a memory input-output relationship, FIG. 25B shows a table indicating the memory input-output relationship, FIG. 25C shows a procedure of the eighth embodiment, and FIG. 25D shows a circuit configuration. In this embodiment, an equalizing table is formed by using inversion transform of an operation matrix indicating the input-output relationship of an equalizing cell.

That is, the input-output relationship table shown in FIG. 25B is formed from the input-output relationship as shown in FIG. 25A (step S30). This table is defined as a transform matrix table A (step S31). Subsequently, an inverse transform matrix $A^{-1}$ of the transform matrix A is obtained (step S32). A memory output signal is A/D-converted by an A/D converter 29. The converted signal is input to a lookup table 28 and subjected to the above arithmetic operation. The output is D/A-converted by a D/A converter 30 to obtain an equalized output. Note that the A/D converter 29 and the D/A converter 30 are not necessarily used.

Another method of the eighth embodiment will be described below by using FIGS. 26A and 26B. As shown in FIG. 13, the relationship between the input voltage and the output voltage of a memory cell using a thin ferroelectric film is not linear. "Linear" means that the input function and the output function are in a proportional relationship multiplied by a coefficient. Therefore, problems such as distortions and harmonics having influences on the quality of a signal occur. Accordingly, an equalizing circuit for correcting a memory output is necessary. Correction data needs to be formed each time a read operation is performed since the above-mentioned nonlinear relationship changes in accordance with the use environment such as the temperature or the time after a write operation as well as the formation method of a ferroelectric material or variations in materials.

It is, however, not easy to form an equalizing table or a lookup table used in the formation of correction data, since the formation of these tables requires complicated analog conversion and digital conversion and a digital signal processor (DSP).

As a more simplified method, therefore, to indicate an input-output relationship of an equalizing cell as shown in FIG. 26A, an output voltage Vo is represented by a polynomial using ai and an input voltage Vi (Vo=a0+a1Vi+a2Vi$^2$+ ... ), and the equalizing table as shown in FIG. 25B is formed by using an inverse transform polynomial (Vi= b0+b1Vo+b2Vo$^2$+ ... ) using bi and Vo. This polynomial can also be represented by using diodes or nonlinear elements.

The ninth embodiment of the present invention will be described below. FIGS. 27A and 27B illustrate memory input-output relationships for explaining the ninth embodiment. The concept of this ninth embodiment is identical to that of the sixth embodiment. However, the ninth embodiment uses a linear region instead of an equalizing table and a lookup table because these tables complicate the configuration or increase the cost.

That is, analog recording is performed by using a linear region in the voltage-charge characteristic of a thin ferroelectric film shown in FIG. 27A. Thereafter, high-quality analog recording can be realized only by using simple linear amplification. As shown in FIG. 27B, analog recording can also be performed by using a region where the shift from a linear region is 50% or less in the voltage-charge characteristic of a thin ferroelectric film. If this is the case, second and third harmonics occur due to distortion or non-linearity. Therefore, it is necessary to remove these nonlinear components by using a means such as equalizing. In the voltage-charge characteristic of a thin ferroelectric film, the amplitude center of an analog signal is set in the center of a linear region. This makes the most efficient analog signal recording feasible.

The 10th embodiment of the present invention will be described below. The 10th embodiment uses a linear region instead of an equalizing table and a lookup table because these tables complicate the configuration or increase the cost.

FIG. 28 shows the configuration of the 10th embodiment, in which analog recording is performed by using portions of a linear region and a nonlinear region in the voltage-charge characteristic of a thin ferroelectric film. This device comprises an input terminal 14 for inputting an analog signal of, e.g., sounds or images, a preprocessing circuit 11 for applying a voltage offset to the analog signal, a recording circuit 10 for recording the analog signal, an output terminal 15 for extracting the output signal to the outside, an address control circuit 17 using a clock circuit 18, and a postprocessing circuit 12 consisting of an equalizing circuit 25 and zero-level adjusting circuit 31.

The recording circuit 10 includes a memory cell 24, X- and Y-address circuits 20 and 21 controlled by the address control circuit 17, a read circuit 23, and a write circuit 22.

Note that an external clock 19 supplied from the outside can also be used instead of the clock of the clock circuit 18.

The 11th embodiment of the present invention will be described below. FIG. 29 shows the configuration of the 11th embodiment. In the embodiment shown in FIG. 15, no rewrite operation is performed. Therefore, when the memory cell shown in FIG. 14 is used, information destruction occurs when a read operation is performed once. No rewrite operation needs to be performed in a nondestructive device such as a ferroelectric gate type device. However, in a destructive device it is necessary to perform a rewrite operation by using the configuration as shown in FIG. 29.

This device comprises an input terminal 14 for inputting an analog signal of, e.g., sounds or images, a preprocessing circuit 11 for applying a voltage offset to the analog signal, a recording circuit 10 for recording the analog signal, an output terminal 15 for extracting the output signal to the outside, an address control circuit 17 using a clock circuit 18, a postprocessing circuit 12 consisting of an equalizing circuit 25 and zero-level adjusting circuit 31, and a rewrite line 40 for performing a rewrite operation by using the signal subjected to equalizing processing, such as distortion correction, performed by the equalizing circuit 25. The recording circuit 10 includes a memory cell 24, X- and Y-address circuits 20 and 21 controlled by the address control circuit 17, a read circuit 23, and a write circuit 22. The equalizing circuit 25 can also be separated into output and rewrite circuits.

Figure 30:
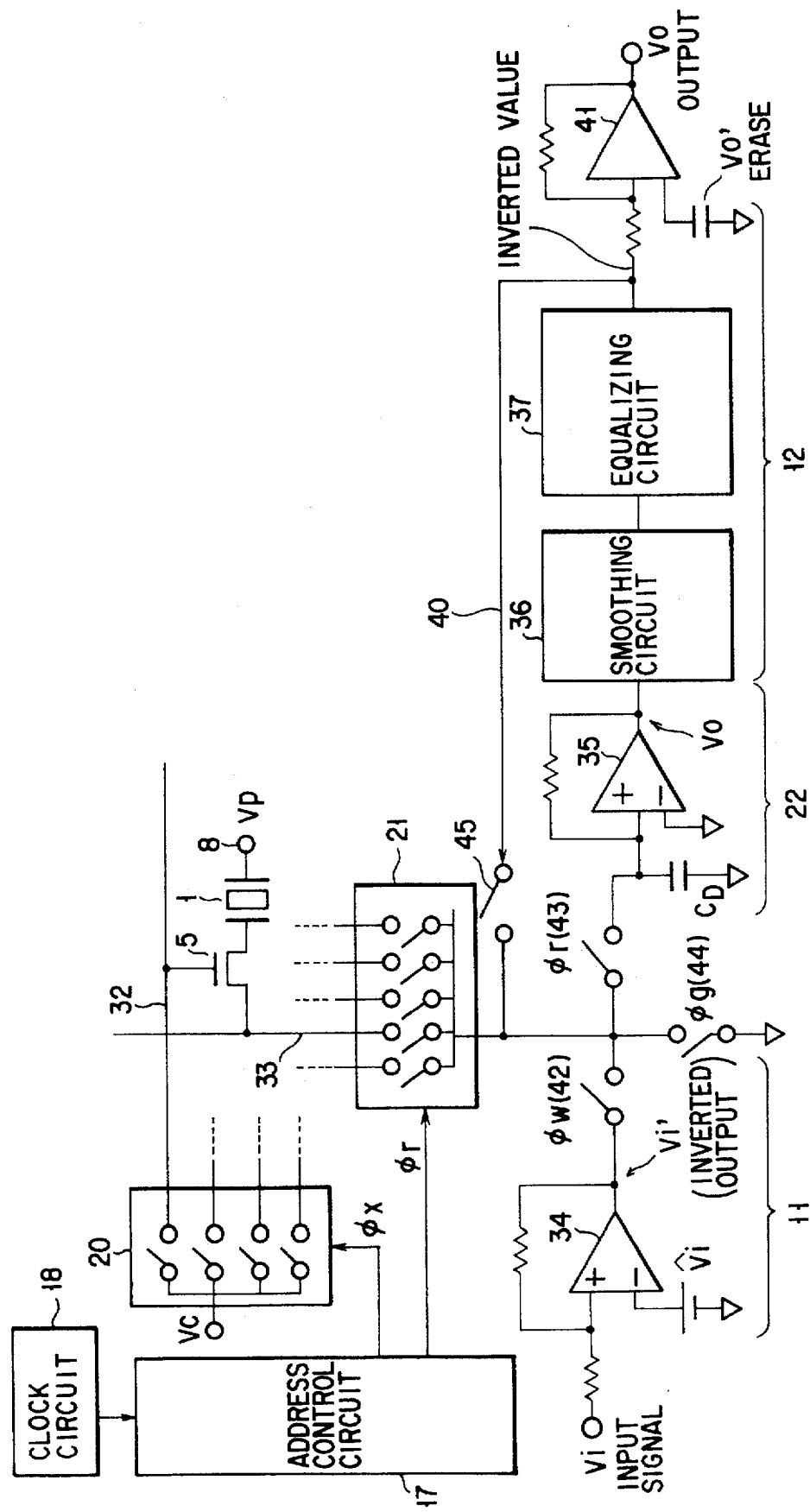
FIG. 30 is a block diagram showing the configuration of the 12th embodiment.
Figure 35:
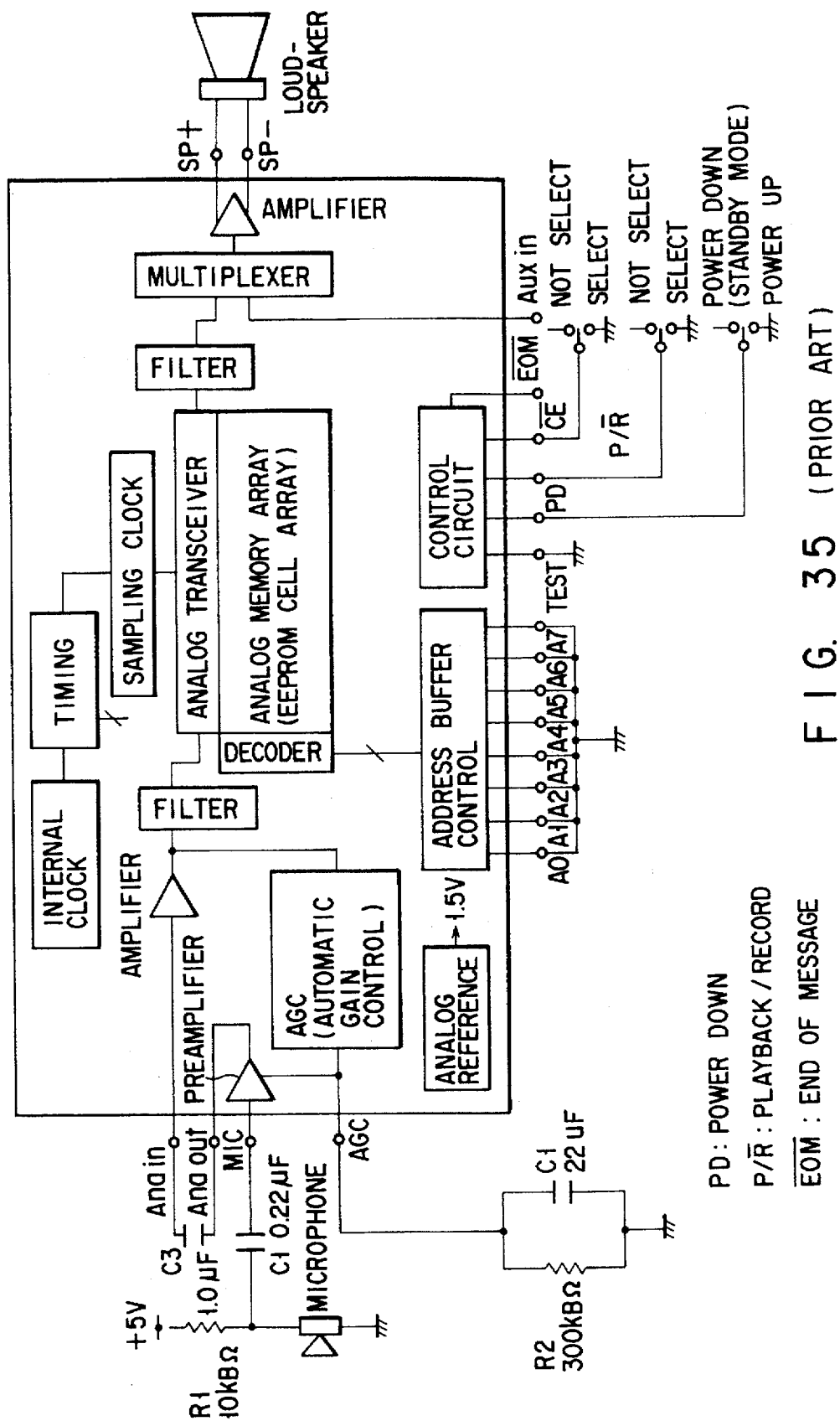
FIG. 35 is a block diagram for explaining a first example of the conventional techniques.
Figure 36:
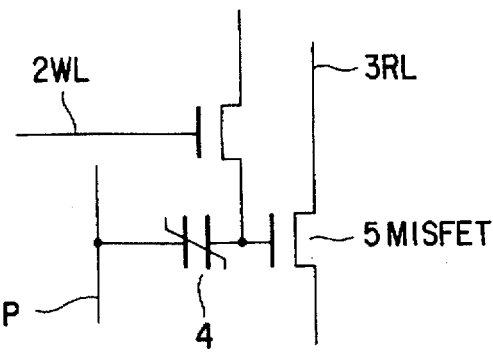
FIG. 36 is a circuit diagram for explaining a second example of the conventional techniques.
Figure 37:
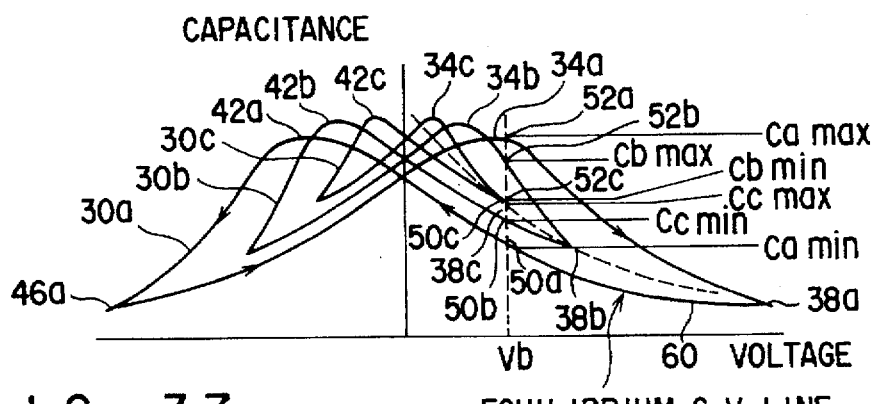
FIG. 37 is a graph for explaining a third example of the conventional techniques.
Figure 38:
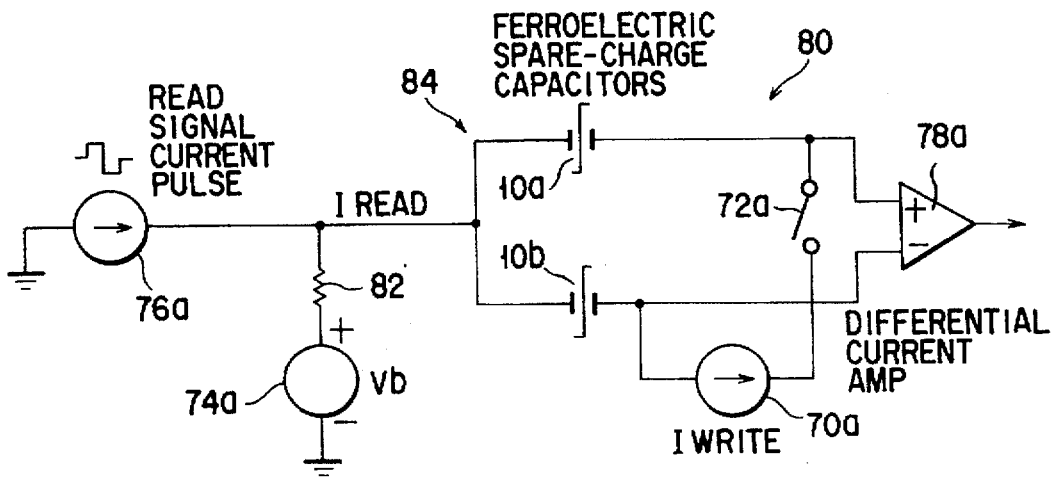
FIG. 38 is a circuit diagram for explaining the third example of the conventional techniques.

The 12th embodiment of the present invention will be described below. FIG. 30 shows the configuration of the 12th embodiment. This device comprises a memory cell constituted by a ferroelectric capacitor 1 and a pass-gate transistor 5, an X line 32 for controlling the pass-gate transistor 5, a plate line 8 for applying a voltage to the memory cell, a data line 33 on which a cell output appears, X- and Y-address SWs 20 and 21 for selecting the X line 32 and the data line 33, an address control circuit 17, a preprocessing circuit 11, a read circuit 22, a rewrite circuit 40, a postprocessing circuit 12, an external or internal clock circuit 18, an input SW 42, a read SW 43, and a discharge SW 44.

The preprocessing circuit 11 includes an inverting amplifier 34, and an input signal is offset to a reference voltage. The read circuit 22 includes an inverting amplifier 35. The postprocessing circuit 12 includes a smoothing circuit 36 and an equalizing circuit 37. A signal subjected to smoothing and distortion correction is supplied to the rewrite line 40. An output unit includes an inverting amplifier 41. The read circuit 22 can also be a load capacitor.

The 13th embodiment of the present invention will be described below. FIGS. 31A to 31F are views for explaining the 13th embodiment. This 13th embodiment has the same configuration as the 12th embodiment except for a driving method and a write method. That is, when a write operation is performed, an X-address SW 20 and a Y-address SW 21 are synchronized with the clocks of a clock circuit 18, and a plate line 8 is held at 0 V or low level. An input SW 42 is arranged between the X- and Y-address SWs 20 and 21. Information of the inverted signal of an offset input voltage is recorded at the switching timing of the input SW 42. As shown in FIG. 31F, the voltage applied to the ferroelectric material has a polarity opposite to that of a write signal when the input SW 42 is turned on.

The 14th embodiment of the present invention will be described below. FIGS. 32A to 32H are views for explaining the 14th embodiment. This 14th embodiment has the same configuration as the 12th embodiment except for actual drive and read methods. That is, when a read operation is performed, an X-address SW 20 and a Y-address SW 21 are synchronized with the clocks of a clock circuit 18. After a data line is discharged by switching a discharge SW 44, a read SW 43 is turned on to turn on a read circuit 22, and a plate line 8 is held at Vp or high level. A read potential is applied to a ferroelectric capacitor 1 and at the same time the output is read out.

The 15th embodiment of the present invention will be described below. FIGS. 33A to 33I are views for explaining the 15th embodiment. This 15th embodiment has the same configuration as the 14th embodiment except for an actual drive and read methods. That is, a plate line 8 is held at 0 V or low level, and a read SW 43 is turned off. Thereafter, a rewrite SW 45 is turned on to perform a rewrite operation in the same memory cell.

The 16th embodiment of the present invention will be described below. FIGS. 34A and 34B are views for explaining the 16th embodiment. FIG. 34A shows an input signal, and FIG. 34B shows an address clock for performing recording in each address of a memory cell. This 16th embodiment has the same configuration as the 12th embodiment except that the frequency of the address control clock in FIG. 31A is designed between 4 and 10 kHz, in order to obtain quality by which this device can be applied to telephones or digital portable telephones. When the clock frequency is 4 to 10 kHz, the voice band can be set between 2 and 5 kHz. Consequently, voices can be recorded for 5 to 30 seconds when a 60-Kbit ferroelectric memory is used. This recording time is long enough for, e.g., toys. Also, three minutes of voices can be recorded with a 1-Mbit ferroelectric memory. This recording time is long enough to record common memorandums and is particularly optimum for answering telephones, portable telephones, interphones, and electronic notebooks. Furthermore, voices can be recorded for 10 to 300 minutes by the use of a 32-Mbit ferroelectric memory. This recording time is suitable for normal recorders.

The 17th embodiment of the present invention will be described below with reference to FIGS. 34A and 34B. The 17th embodiment has the same configuration as the 12th embodiment except that a clock frequency for controlling addresses is set between 8 and 30 kHz in order to use the device to record, e.g., music. Consequently, the recording time is shorter but the quality of sounds is higher than those in the 16th embodiment.

According to the present invention, analog signals can be stably written and read for long periods of time.

The embodiments described above can be summarized as follows.

1. Domains in a ferroelectric material are polarized in the same direction by applying a first pulse having a voltage higher than a coercive voltage Vc to a first polarized state of two states of spontaneous polarization (polarization). Subsequently, a second pulse having a voltage Vw of an arbitrary value whose polarity is opposite to the polarity of the first applied voltage is applied. Analog recording is performed in a partially polarized state containing both domains having polarization in the first direction and domains having polarization in a second direction opposite to the first direction.

As described above, when a write operation is performed, a very stable state of partial polarization, rather than complete polarization, can be formed by applying a pulse with a polarity opposite to the polarity of the first pulse. This partially polarized state takes a continuous state with respect to a write voltage and is very stable for long time periods. This allows write and read operations of analog signals.

2. In a memory cell selected from a plurality of memory cells, domains in a thin ferroelectric film are polarized in the same direction by applying a first pulse having an applied voltage Ve higher than a coercive voltage Vc to a first polarized state of two states of spontaneous polarization (polarization) of the thin ferroelectric film. Subsequently, a second pulse having a voltage Vw of an arbitrary value whose polarity is opposite to the polarity of the applied voltage Ve is applied. Analog recording is performed in a partially polarized state containing both domains having polarization in the first direction and domains having polarization in a second direction opposite to the first direction.

As described above, when a write operation is performed, a very stable state of partial polarization, rather than complete polarization, can be formed by applying a pulse with a polarity opposite to the polarity of the first pulse to a thin ferroelectric film in a memory cell selected from a plurality of memory cells. This partially polarized state takes a continuous state with respect to a write voltage and is very stable for long time periods. This allows write and read operations of analog signals.

3. Domains in a ferroelectric material are polarized in the same direction by applying a first pulse having an applied voltage Ve higher than a coercive voltage Vc to a first polarized state of two states of spontaneous polarization (polarization). Subsequently, a second pulse having an arbitrary voltage Vw whose polarity is opposite to the polarity of the applied voltage Ve and having an arbitrary pulse width is applied. Analog recording is performed in a partially polarized state containing both domains having polarization in the first direction and domains having polarization in a second direction opposite to the first direction.

As described above, when a write operation is performed, a very stable state of partial polarization, rather than complete polarization, can be formed by applying a pulse having a controlled width and a controlled voltage with a polarity opposite to the polarity of the first pulse to a thin ferroelectric film in a memory cell selected from a plurality of memory cells. This partially polarized state takes a continuous state with respect to a write voltage and is very stable for long time periods. This allows write and read operations of analog signals.

4. Recording of sounds or images is performed by using a single chip by adding an input circuit, a control circuit, and an output circuit to a ferroelectric memory circuit for performing analog recording. Sounds or images can be extremely easily recorded by using a single chip.

5. Recording of sounds or images is performed by using a single chip by adding an input circuit, a control circuit, and an output circuit to a ferroelectric memory circuit which has a memory cell selection method and performs analog recording. Sounds or images can be extremely easily recorded with a high accuracy by using a single chip.

6. An analog signal is input to a ferroelectric memory circuit for performing analog recording and sampled-and-held inside the chip. Also, distortions or harmonic components of an output signal are reduced. Thus an analog signal can be recorded in a ferroelectric memory cell by inputting the analog signal to the ferroelectric memory circuit and sampling-and-holding the signal inside the chip.

7. An analog signal is input to a ferroelectric memory circuit for performing analog recording and sampled-and-held inside the chip, thereby performing address control. Consequently, data can be stored in a necessary address region.

8. In a ferroelectric memory circuit for performing analog recording, an equalizer circuit is arranged between a read circuit and a write circuit to supply an equalized output to an output circuit. A memory read signal is converted and rewritten from a rewrite line. Since this minimizes distortions or harmonics, the signal output can be converted into a state very close to the input signal. This improves the sound quality or the image quality. Also, a rewrite operation can be performed.

9. An analog signal is input to a ferroelectric memory circuit for performing analog recording, and an analog output is converted into the input signal by an equalizing circuit. This signal is also used in a rewrite operation. Since this minimizes distortions or harmonics, the signal output can be converted into a state very close to the input signal. This improves the sound quality or the image quality. Also, a rewrite operation can be performed.

10. An analog signal is input to a ferroelectric memory circuit for performing analog recording, and an analog signal is equalized to the input signal by an equalizing circuit. The conditions of equalization are determined on the basis of an equalizing table formed when the signal is written and read out. Since this minimizes distortions or harmonics, the signal output can be converted into a state very close to the input signal. This corrects the variations caused by environmental conditions and the variations between the lots, and improves the sound quality or the image quality. Also, a rewrite operation can be performed.

11. An analog signal is input to a ferroelectric memory circuit for performing analog recording, and an analog signal is equalized to the input signal by an equalizing circuit. The conditions of equalization are constituted by polynomials, and analog correction is performed. Since this minimizes distortions or harmonics, the signal output can be converted into a state very close to the input signal. This improves the sound quality or the image quality. Also, a rewrite operation can be performed.

12. In a ferroelectric memory circuit for performing analog recording, an analog signal is recorded by using a linear region. Since this minimizes distortions or harmonics, the signal output can be converted into a state very close to the input signal. This improves the sound quality or the image quality.

13. In a ferroelectric memory circuit for performing analog recording, an analog signal is recorded by using a linear region by offsetting an input voltage. Since this minimizes distortions or harmonics, the signal output can be converted into a state very close to the input signal. This improves the sound quality or the image quality.

14. In a ferroelectric memory circuit for performing analog recording, an output voltage is smoothed. Since this minimizes distortions or harmonics, the signal output can be converted into a state very close to the input signal. This improves the sound quality or the image quality.

15. In a ferroelectric memory circuit for performing analog recording, a circuit configuration of one embodiment is accomplished by using a ferroelectric memory cell having a pass-gate transistor. This realizes a ferroelectric memory circuit capable of high-quality analog recording of sounds or images.

16. In a ferroelectric memory circuit for performing analog recording, a circuit configuration and drive and write methods of another embodiment are accomplished by using a ferroelectric memory cell having a pass-gate transistor. This realizes a ferroelectric memory circuit capable of high-quality analog recording of sounds or images.

17. In a ferroelectric memory circuit for performing analog recording, a circuit configuration and drive and write methods of still another embodiment are accomplished by using a ferroelectric memory cell having a pass-gate transistor. This realizes a ferroelectric memory circuit capable of high-quality analog recording of sounds or images.

18. In a ferroelectric memory circuit for performing analog recording, a circuit configuration and drive and rewrite methods of still another embodiment are accomplished by using a ferroelectric memory cell having a pass-gate transistor. This realizes a ferroelectric memory circuit capable of high-quality analog recording of sounds or images.

19. In a ferroelectric memory circuit for performing analog recording, a divided frequency of still another embodiment is achieved. This realizes a ferroelectric memory circuit capable of high-quality analog recording of sounds or images.

Additional advantages and modifications will readily occur to those skilled in the art. Therefore, the invention in its broader aspects is not limited to the specific details, and representative devices shown and described herein. Accordingly, various modifications may be made without departing from the spirit or scope of the general inventive concept as defined by the appended claims and their equivalents.

What is claimed is:

1. A ferroelectric memory having a thin ferroelectric film sandwiched between a pair of electrodes as a memory cell, comprising:

first pulse applying means for applying a first pulse having a voltage Ve higher than a coercive voltage Vc of said thin ferroelectric film to said memory cell, thereby forming a polarized state in a first direction of two states of polarization;

second pulse applying means for applying to said memory cell a second pulse having a voltage Vw whose polarity is opposite to a polarity of the first pulse applied by said first pulse applying means, thereby forming a partially polarized state containing both domains having polarization in the first direction and domains having polarization in a second direction opposite to the first direction; and analog recording means for performing analog recording by controlling the partially polarized state by using the second pulse applied by said second pulse applying means.

2. A memory according to claim 1, further comprising a switching element added to each memory cell.

3. A memory according to claim 2, wherein said switching element is a three-terminal selective switching element added to each memory cell, one of said pair of electrodes is connected to a current control terminal of said three-terminal selective switching element, and a cell selection control signal is supplied to said current control terminal.

4. A memory according to claim 3, wherein said three-terminal selective switching element is a field-effect transistor (FET), one of said pair of electrodes is connected to a source or a drain of the FET, and a cell selection control signal is supplied to a gate of the FET.

5. A memory according to any one of claims 1 and 2, wherein an absolute value of a magnitude Ve of the first pulse and an absolute value of a magnitude Vw of the second pulse satisfy Vw≦We.

6. A memory according to claim 1, wherein a pulse width Ww of the second pulse is 1% to 300% of a pulse width We of the first pulse.

7. A memory according to claim 4, wherein a pulse width We of the first pulse and a pulse width Ww of the second pulse satisfy Ww≦We.

8. A memory according to claim 1, wherein a polarization amount of the partially polarized state is 10% to 90% of a polarization amount of the first polarized state.

9. A device according to claim 1, wherein an equalizing circuit is arranged between an output of a memory cell and an output terminal of a memory and forms an analog operation lookup table in accordance with an input-output relationship of an analog signal previously written in said memory cell, and an equalized output is obtained by inputting an output signal from the memory cell to the lookup table.

10. A device according to claim 1, wherein an equalizing circuit is arranged between an output of a memory cell and an output terminal of a memory and forms a digital operation lookup table in accordance with an input-output relationship of an analog signal previously written in said memory cell, and an equalized output is obtained by A/D-converting an output signal from the memory cell, inputting this converted signal to the lookup table, and D/A-converting an output from the lookup table.

11. A device according to claim 1, wherein an equalizing table is formed each time a certain amount of information is written, and an equalized output is obtained by using the equalizing table when the information is read.

12. A device according to claim 11, wherein preprocessing for forming an equalizing table is performed before a memory recording operation, and an equalized output is obtained by using the equalizing table when a read operation is performed.

13. A device according to claim 12, wherein an equalizing table is formed before a memory read operation, and an equalized output is obtained by using the equalizing table when a read operation is performed.

14. A device according to any one of claims 11, 12, and 13, wherein the equalizing table is formed by using an equalizing cell arranged in the same chip and having the same configuration as the memory cell.

15. A device according to any one of claims 11, 12, and 13, wherein an equalizing cell has the same configuration as said memory cell.

16. A device according to any one of claims 11, 12, and 13, wherein the equalizing table is formed by using inverse transform of an operation matrix indicating an input-output relationship of an equalizing cell.

17. A device according to any one of claims 11, 12, and 13, wherein an output voltage is represented by a polynomial of an input voltage in order to indicate an input-output relationship of an equalizing cell, and the equalizing table is formed by using inverse transform of the polynomial.

18. A device according to claim 1, wherein analog recording is performed by using a linear region in a voltage-charge characteristic of said thin ferroelectric film.

19. A device according to claim 1, wherein analog recording is performed by using a region in which a shift from a linear region is not more than 50% in a voltage-charge characteristic of said thin ferroelectric film.

20. A device according to any one of claims 18 and 19, wherein an amplitude center of an analog signal is set in a center of a linear region in a voltage-charge characteristic of said thin ferroelectric film.

* * * * *